US011934666B2

(12) United States Patent
Koudele et al.

(10) Patent No.: US 11,934,666 B2
(45) Date of Patent: *Mar. 19, 2024

(54) MEMORY DEVICE WITH DYNAMIC PROGRAM-VERIFY VOLTAGE CALIBRATION

(71) Applicant: Micron Technology, Inc., Boise, ID (US)

(72) Inventors: Larry J. Koudele, Erie, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,733

(22) Filed: May 27, 2022

(65) Prior Publication Data

US 2022/0291847 A1    Sep. 15, 2022

Related U.S. Application Data

(63) Continuation of application No. 16/566,640, filed on Sep. 10, 2019, now Pat. No. 11,347,405, which is a
(Continued)

(51) Int. Cl.
*G06F 3/06* (2006.01)
*G11C 11/56* (2006.01)
(Continued)

(52) U.S. Cl.
CPC ............ *G06F 3/0619* (2013.01); *G06F 3/061* (2013.01); *G06F 3/065* (2013.01); *G06F 3/0688* (2013.01);
(Continued)

(58) Field of Classification Search
CPC ........ G06F 3/0619; G06F 3/061; G06F 3/065; G06F 3/0688; G11C 11/5628;
(Continued)

(56) References Cited

U.S. PATENT DOCUMENTS 7,437,498 B2   10/2008   Ronen
8,006,166 B2   8/2011    Roohparvar et al.
(Continued)

FOREIGN PATENT DOCUMENTS

GB   2383455 A   6/2003
GB   2537484 A   10/2016
(Continued)

OTHER PUBLICATIONS

Korean Application No. 10-2022-7009917—Office Action with English Translation dated Jul. 29, 2022, 12 pages.
(Continued)

*Primary Examiner* — Jerome Leboeuf
(74) *Attorney, Agent, or Firm* — Perkins Coie LLP

(57) ABSTRACT

A memory system includes a memory array including a plurality of memory cells; and a controller coupled to the memory array, the controller configured to: determine a target profile including distribution targets, wherein each of the distribution targets represent a program-verify target corresponding to a logic value for the memory cells, determine a feedback measure based on implementing a processing level for processing data, and dynamically adjust the program-verify target according to the feedback measure.

16 Claims, 9 Drawing Sheets

Related U.S. Application Data continuation of application No. 16/009,091, filed on Jun. 14, 2018, now Pat. No. 10,521,140, which is a continuation of application No. 15/605,855, filed on May 25, 2017, now Pat. No. 10,140,040.

(51) Int. Cl.
*G11C 16/34* (2006.01)
*G11C 29/02* (2006.01)

(52) U.S. Cl.
CPC ...... *G11C 11/5628* (2013.01); *G11C 16/3459* (2013.01); *G11C 16/3495* (2013.01); *G11C 29/021* (2013.01); *G11C 29/028* (2013.01); *G11C 2207/2254* (2013.01); *G11C 2211/5621* (2013.01)

(58) Field of Classification Search
CPC ............ G11C 16/3459; G11C 16/3495; G11C 29/021; G11C 29/028; G11C 2207/2254; G11C 2211/5621; G11C 16/0483
See application file for complete search history.

(56) References Cited

U.S. PATENT DOCUMENTS

| | | |
|---|---|---|
| 8,112,064 B2 | 2/2012 | Fukaya et al. |
| 9,092,350 B1 | 7/2015 | Jeon et al. |
| 9,117,536 B2 | 8/2015 | Yoon et al. |
| 9,153,336 B1 | 10/2015 | Yang et al. |
| 9,355,735 B1 | 5/2016 | Chen et al. |
| 9,367,391 B2 | 6/2016 | Lam |
| 9,454,420 B1 | 9/2016 | Tai et al. |
| 9,472,298 B1 | 10/2016 | Louie et al. |
| 9,558,850 B1 | 1/2017 | Bialas et al. |
| 9,761,308 B1 | 9/2017 | Cometti |
| 10,140,040 B1 | 11/2018 | Koudele et al. |
| 10,170,195 B1 | 1/2019 | Ioannou et al. |
| 10,210,926 B1 | 2/2019 | Amiri et al. |
| 10,276,233 B1 | 4/2019 | Danjean et al. |
| 10,379,739 B1 | 8/2019 | Bazarsky et al. |
| 10,388,376 B2 | 8/2019 | Molas et al. |
| 10,452,480 B2 | 10/2019 | Koudele et al. |
| 10,521,140 B2 | 12/2019 | Koudele et al. |
| 10,566,061 B2 | 2/2020 | Karakulak et al. |
| 10,566,063 B2 | 2/2020 | Sheperek et al. |
| 10,664,194 B2 | 5/2020 | Sheperek et al. |
| 10,877,827 B2 | 12/2020 | Miladinovic |
| 10,936,205 B2 | 3/2021 | Papandreou et al. |
| 10,963,327 B2 | 3/2021 | Camp et al. |
| 10,990,466 B2 | 4/2021 | Cadloni et al. |
| 11,176,036 B2 | 11/2021 | Camp et al. |
| 11,177,006 B2 | 11/2021 | Sheperek et al. |
| 11,347,405 B2 * | 5/2022 | Koudele ............... G06F 3/061 |
| 11,416,173 B2 | 8/2022 | Sheperek et al. |
| 2002/0152459 A1 | 10/2002 | Bates et al. |
| 2005/0201148 A1 | 9/2005 | Chen et al. |
| 2006/0277429 A1 | 12/2006 | Dasari et al. |
| 2007/0025167 A1 | 2/2007 | Ziegelmayer et al. |
| 2007/0234144 A1 | 10/2007 | Gongwer et al. |
| 2009/0055680 A1 | 2/2009 | Honda et al. |
| 2009/0310404 A1 | 12/2009 | Cho et al. |
| 2010/0073069 A1 | 3/2010 | Wang et al. |
| 2010/0097857 A1 | 4/2010 | Cernea |
| 2010/0188919 A1 | 7/2010 | Fox et al. |
| 2011/0013460 A1 | 1/2011 | Dong et al. |
| 2011/0119431 A1 | 5/2011 | Chowdhury |
| 2011/0167307 A1 | 7/2011 | Mori |
| 2011/0305090 A1 | 12/2011 | Roohparvar et al. |
| 2012/0030531 A1 | 2/2012 | Brewerton et al. |
| 2012/0213001 A1 | 8/2012 | Yang |
| 2012/0236641 A1 | 9/2012 | Hu |
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117604 A1 | 5/2013 | Ha |
| 2013/0117635 A1 | 5/2013 | Ok et al. |
| 2013/0132652 A1 | 5/2013 | Wood et al. |
| 2013/0227200 A1 | 8/2013 | Cometti et al. |
| 2013/0346805 A1 | 12/2013 | Sprouse et al. |
| 2014/0026003 A1 | 1/2014 | Chen et al. |
| 2014/0068365 A1 | 3/2014 | Chen et al. |
| 2014/0119124 A1 | 5/2014 | Kim et al. |
| 2014/0136928 A1 | 5/2014 | Mu et al. |
| 2014/0143630 A1 | 5/2014 | Mu et al. |
| 2014/0153330 A1 | 6/2014 | Yoon et al. |
| 2014/0157065 A1 | 6/2014 | Ong |
| 2014/0281661 A1 | 9/2014 | Milton et al. |
| 2014/0281767 A1 | 9/2014 | Alhussien et al. |
| 2014/0355340 A1 | 12/2014 | Sharon et al. |
| 2014/0380123 A1 | 12/2014 | Liikanen et al. |
| 2015/0036432 A1 | 2/2015 | Huang |
| 2015/0085573 A1 | 3/2015 | Sharon et al. |
| 2015/0154064 A1 | 6/2015 | Ghaly et al. |
| 2015/0279473 A1 | 10/2015 | Yoo et al. |
| 2015/0309858 A1 | 10/2015 | Weilemann et al. |
| 2015/0378415 A1 | 12/2015 | George |
| 2016/0041891 A1 | 2/2016 | Malshe et al. |
| 2016/0092496 A1 | 3/2016 | Dietterich et al. |
| 2016/0099049 A1 | 4/2016 | Lee et al. |
| 2016/0099078 A1 | 4/2016 | Luo et al. |
| 2016/0117216 A1 | 4/2016 | Muchherla et al. |
| 2016/0132256 A1 | 5/2016 | Jung |
| 2016/0133334 A1 | 5/2016 | Zhang et al. |
| 2016/0147582 A1 | 5/2016 | Karakulak et al. |
| 2016/0148701 A1 | 5/2016 | Karakulak et al. |
| 2016/0148702 A1 | 5/2016 | Karakulak et al. |
| 2016/0148708 A1 | 5/2016 | Tuers et al. |
| 2016/0162185 A1 | 6/2016 | D'Abreu et al. |
| 2016/0179406 A1 | 6/2016 | Gorobets et al. |
| 2016/0218740 A1 | 7/2016 | Parthasarathy et al. |
| 2016/0225436 A1 | 8/2016 | Wang et al. |
| 2016/0232054 A1 | 8/2016 | Durgam et al. |
| 2016/0259693 A1 | 9/2016 | Sundararaman et al. |
| 2016/0266792 A1 | 9/2016 | Amaki et al. |
| 2017/0053714 A1 | 2/2017 | Guy et al. |
| 2017/0091039 A1 | 3/2017 | Hong |
| 2017/0097868 A1 | 4/2017 | Kim et al. |
| 2017/0126255 A1 | 5/2017 | Colgrove et al. |
| 2017/0148510 A1 | 5/2017 | Bazarsky et al. |
| 2017/0148525 A1 | 5/2017 | Kathawala et al. |
| 2017/0215111 A1 | 7/2017 | Lu et al. |
| 2017/0241843 A1 | 8/2017 | Jeon et al. |
| 2017/0263311 A1 | 9/2017 | Cometti |
| 2017/0269991 A1 | 9/2017 | Bazarsky et al. |
| 2017/0271031 A1 | 9/2017 | Sharon et al. |
| 2018/0189125 A1 | 7/2018 | Karlik et al. |
| 2018/0277228 A1 | 9/2018 | Takada et al. |
| 2018/0341416 A1 | 11/2018 | Koudele et al. |
| 2018/0341552 A1 | 11/2018 | Liikanen et al. |
| 2018/0341553 A1 | 11/2018 | Koudele et al. |
| 2018/0374550 A1 | 12/2018 | Barndt et al. |
| 2019/0043588 A1 | 2/2019 | Fisher et al. |
| 2019/0066802 A1 | 2/2019 | Malshe et al. |
| 2019/0103164 A1 | 4/2019 | Malshe et al. |
| 2019/0147964 A1 | 5/2019 | Yun et al. |
| 2019/0164599 A1 | 5/2019 | Avraham et al. |
| 2019/0171381 A1 | 6/2019 | Ioannou et al. |
| 2019/0172542 A1 | 6/2019 | Miladinovic |
| 2019/0278653 A1 | 9/2019 | Padilla et al. |
| 2019/0354312 A1 | 11/2019 | Chew et al. |
| 2019/0354313 A1 | 11/2019 | Sheperek et al. |
| 2019/0355426 A1 | 11/2019 | Sheperek et al. |
| 2019/0391865 A1 | 12/2019 | Cadloni et al. |
| 2020/0004440 A1 | 1/2020 | Koudele et al. |
| 2020/0004632 A1 | 1/2020 | Koudele et al. |
| 2020/0010459 A1 | 1/2020 | Van Dongen et al. |
| 2020/0019453 A1 | 1/2020 | Chew et al. |
| 2020/0019459 A1 | 1/2020 | Cadloni et al. |
| 2020/0117387 A1 | 4/2020 | Cadloni et al. |
| 2020/0118620 A1 | 4/2020 | Bazarsky et al. |
| 2020/0168282 A1 | 5/2020 | Sheperek et al. |
| 2020/0241801 A1 | 7/2020 | Sheperek et al. |

(56) References Cited

U.S. PATENT DOCUMENTS

| | | |
|---|---|---|
| 2020/0411117 A1 | 12/2020 | Malshe et al. |
| 2021/0012857 A1 | 1/2021 | Xie et al. |
| 2021/0027846 A1 | 1/2021 | Malshe et al. |
| 2021/0191638 A1 | 6/2021 | Miladinovic et al. |
| 2021/0200613 A1 | 7/2021 | Cadloni et al. |
| 2022/0036957 A1 | 2/2022 | Sheperek et al. |
| 2022/0391143 A1 | 12/2022 | Sheperek et al. |
| 2023/0057932 A1 | 2/2023 | Noh et al. |

FOREIGN PATENT DOCUMENTS

| | | |
|---|---|---|
| KR | 20060054374 A | 5/2006 |
| KR | 20090048130 A | 5/2009 |
| KR | 20140072637 A | 6/2014 |
| WO | 2005010638 A2 | 2/2005 |

OTHER PUBLICATIONS

European Application No. 18805869.7—Examination Report dated Mar. 22, 2022, 7 pages.
Korean Patent Application No. 10-2019-7037973—Notice of Reasons for Rejection dated Apr. 8, 2022, 12 pages.
EP Patent Application No. 18805869.7—Extended European Search Report, dated Jan. 22, 2021, 8 pages.
EP Patent Application No. 18806016.4—Extended European Search Report, dated Mar. 5, 2021, 12 pages.
EP Patent Application No. 18806327.5—Partial Supplementary European Search Report, dated Jan. 29, 2021, 16 pages.
EP Patent Application No. 19821879.4—Extended European Search Report, dated Feb. 1, 2022, 9 pages.
International Application No. PCT/US2018/033873—International Search Report & Written Opinion, dated Sep. 7, 2018, 9 pages.
International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
KR Patent Application No. 10-2019-7037973—Korean Office Action and Search Report, dated Dec. 7, 2020, with English Translation, 13 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 bages.
TW Patent Application No. 107117813—Taiwanese Office Action and Search Report, dated Mar. 18, 2019, 17 pages.
PRC (China) Patent Application No. 201880042451.8—Office Action with English Translation dated Mar. 1, 2023, 11 pages.
Korean Patent Application No. 10-2022-7009917—Office Action with English Translation dated Jan. 26, 2023, 7 pages.
European Patent Application No. 18806016.4—Examination Report dated May 16, 2023, 6 pages.
European Patent Application No. 18806327.5—Examination Report dated Jun. 2, 2023, 9 pages.

\* cited by examiner

MEMORY DEVICE WITH DYNAMIC PROGRAM-VERIFY VOLTAGE CALIBRATION

RELATED APPLICATION(S)

This application is a continuation of U.S. application Ser. No. 16/566,640, filed Sep. 10, 2019; which is a continuation of U.S. application Ser. No. 16/009,091, filed Jun. 14, 2018, now U.S. Pat. No. 10,521,140; which is a continuation of U.S. application Ser. No. 15/605,855, filed May 25, 2017, now U.S. Pat. No. 10,140,040; each of which is incorporated herein by reference in its entirety.

This application contains subject matter related to a concurrently-filed U.S. Patent Application by Bruce A. Liikanen and Larry J. Koudele titled "MEMORY DEVICE WITH DYNAMIC PROGRAMMING CALIBRATION." The related application is assigned to Micron Technology, Inc., and is identified by U.S. application Ser. No. 15/605,853, now U.S. Pat. No. 10,402,272. The subject matter thereof is incorporated herein by reference thereto.

This application contains subject matter related to a concurrently-filed U.S. Patent Application by Bruce A. Liikanen and Larry J. Koudele titled "MEMORY DEVICE WITH DYNAMIC PROCESSING LEVEL CALIBRATION." The related application is assigned to Micron Technology, Inc., and is identified by U.S. application Ser. No. 15/605,858, now U.S. Pat. No. 10,452,480. The subject matter thereof is incorporated herein by reference thereto.

TECHNICAL FIELD

The disclosed embodiments relate to memory devices, and, in particular, to memory devices with a mechanism for dynamic calibration of program-verify target.

BACKGROUND

Memory systems can employ memory devices to store and access information. The memory devices can include volatile memory devices, non-volatile memory devices, or a combination device. The non-volatile memory devices can include flash memory employing "NAND" technology or logic gates, "NOR" technology or logic gates, or a combination thereof.

Memory devices, such as flash memory, utilize electrical energy, along with corresponding threshold levels or processing voltage levels, to store and access data. However, the performance or characteristics of the flash memory devices change or degrade over time or usage. The change in performance or characteristics conflicts with the threshold or processing voltage levels over time, leading to errors and other performance issues.

Thus, there is a need for a memory device with dynamic target calibration mechanism. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

Figure 1:
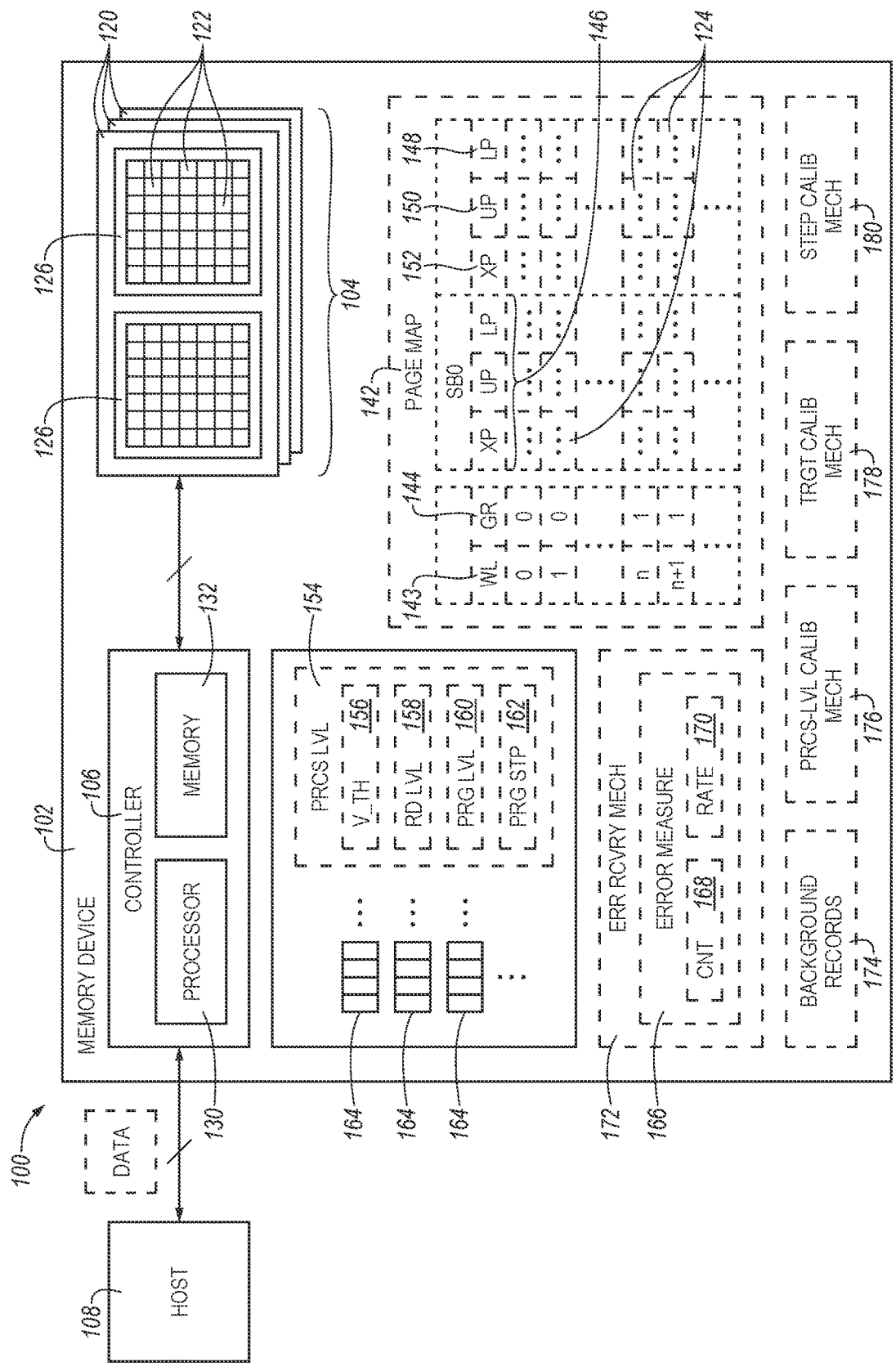
FIG. 1 is a block diagram of a memory system with a dynamic programming calibration mechanism configured in accordance with an embodiment of the present technology.

As described in greater detail below, the technology disclosed herein relates to memory devices, systems with memory devices, and related methods for dynamically calibrating program-verify targets for the memory devices. The memory devices can use a calibration mechanism to dynamically calibrate one or more distribution targets for one or more page types, after initial manufacture or configuration of the memory devices. The memory devices can be configured to dynamically calibrate the program-verify targets while the memory devices are used (e.g., operation).

To calibrate the program-verify targets, the memory devices can gather multiple samples or results, such as data count or error rate, while calibrating various different aspects of the memory devices or while the memory devices are used. The memory devices can use the samples or results to calculate a feedback measure (e.g., the error rate or a difference in error counts corresponding to different read-level voltages used to gather the samples) in calibrating the program-verify targets. Using the feedback, the memory devices can dynamically adjust the program verify targets to balance the error rates with a separation between a threshold voltage and voltages corresponding to adjacent logic states (called read-window budgets or RWB) across different page types.

The following embodiments are described in sufficient detail to enable those skilled in the art to make and use the embodiments. A person skilled in the relevant art, however, will understand that the technology may have additional embodiments and that the technology may be practiced without several of the details of the embodiments described below with reference to FIGS. 1-8.

In the illustrated embodiments below, the memory devices are described in the context of devices incorporating NAND-based non-volatile storage media (e.g., NAND flash). Memory devices configured in accordance with other embodiments of the present technology, however, can include other types of suitable storage media in addition to or in lieu of NAND-based storage media, such as NOR-based storage media, magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

FIG. 1 is a block diagram of a memory system 100 with dynamic processing level calibration mechanism configured in accordance with an embodiment of the present technology. The memory system 100 includes a memory device 102. As shown, the memory device 102 includes a memory array 104 (e.g., NAND flash) and a controller 106. The memory device 102 can operably couple the memory array 104 to a host device 108 (e.g., an upstream central processor (CPU)). The memory array 104 can include circuitry configured to store data in the memory array 104 and provide access to data in the memory array 104. The memory array 104 can be provided as semiconductor, integrated circuits and/or external removable devices in computers or other electronic devices. The memory array 104 includes a plurality of memory regions, or memory units 120. The memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory device 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data. The memory cells 122 can include, for example, floating gate, charge trap, phase change, ferroelectric, magnetoresitive, and/or other suitable storage elements configured to store data persistently or semi-persistently. The memory cells 122 can be one-transistor memory cells that can be can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states, which can be represented by the binary units 1 or 0.

Some flash memory cells can be programmed to a targeted one of more than two data states. For example, a flash memory cell that can be programmed to any one of four states (e.g., represented by the binary 00, 01, 10, 11) can be used to store two bits of data, and may be referred to as a multilevel cell (MLC). Still other flash memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one digit (e.g., more than one bit).

The memory cells 122 can be arranged in rows (e.g., each corresponding to a word line 143) and columns (e.g., each corresponding to a bit line). Each word line 143 can include one or more memory pages 124, depending upon the number of data states the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory device 102 can processing data using different groupings of the memory cells 122. For example, the memory pages 124 of the memory cells 122 can be grouped into memory blocks 126. In operation, the data can be written or otherwise programmed (e.g., erased) with regards to the various memory regions of the memory device 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other embodiments, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory device 100 can include only one memory unit 120. Alternatively, the memory device 100 can include two, three, four, eight, ten, or more (e.g., 16, 32, 64, or more) memory units 120. While the memory units 120 are shown in FIG. 1 as including two memory blocks 126 each, in other embodiments, each memory unit 120 can include one, three, four eight, or more (e.g., 16, 32, 64, 100, 128, 256 or more) memory blocks. In some embodiments, each memory block 123 can include, e.g., 215 memory pages, and each memory page within a block can include, e.g., 212 memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory system 100, including managing the memory device 102 and handling communications between the memory device 102 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 102 illustrated in FIG. 1 has been illustrated as including the controller 106, in another embodiment of the present technology, a memory device may not include a controller, and may instead rely upon external control (e.g., provided by an external host, or by a processor or controller separate from the memory device).

In the illustrated example, further organization or details of the memory array 104 is represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also for example, the memory pages 124 can further correspond to a logical page type 146, such as a lower page (LP) 148, an upper page (UP) 150, or an extra page (EP) 152.

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the upper page 150, the lower page 148, and the extra page 152, can represent a grouping of bits in a specific order for the memory pages 124. The types of pages can correspond to a logical layout, architecture, or value for the memory cells 122. For example, the lower page 148 can represent a first information bit stored in the memory pages 124 or the memory cells 122 therein. The lower page 148 can be for SLC type of cells, MLC type of cells, TLC type of cells, or a combination thereof. Also for example, the upper page 150 can correspond to or represent a second information bit stored in the memory pages 124 or the memory cells 122 therein. The upper page 150 can be for the TLC or MLC types of the memory cells 122. Also for example, the extra page 152 can represent a third information bit, such as for the most significant bit or the least significant bit, stored in the memory pages 124 or the memory cells 122 therein. The extra page 152 can be for the TLC type of the memory cells 122.

The memory device 102 can use processing levels 154 for storing or accessing data. The processing levels 154 can include thresholds or operating levels for voltage or current. The processing levels 154 can include a threshold voltage 156, a read level voltage 158, a programming level voltage 160, a programming step 162, or a combination thereof. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory device 102 can store an amount of charge into the memory cells 122 based on the programming level voltage 160 to represent a corresponding data value. The memory device 102 applies the programming level voltage 160 to control gate or word line to charge up the floating gate or the charge trap. The floating gate or the charge trap can be electrically isolated, which can enable the memory cell to store and hold the charge.

The memory device 102 can use the stored charge to represent data. For example, storing charges on the floating gate or the charge trap can be for storing bit value of 0 for SLC type cells. Bit value of 1 can correspond to the floating gate or the charge trap with no stored charge for the SLC. In other types of cells, such as for MLC, TLC, or QLC, the memory device 102 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above.

The memory device 102 can read or determine data values stored in the memory cells 122 using the read level voltage 158 corresponding to the data value. The memory device 102 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured current or the voltage across the memory cell will correspond to the amount of charges stored in the floating gate or the charge trap.

During operation of the memory device 102, electrical characteristics of the device (i.e. charge retention capabilities) can change due to repeated data writes, erase, and/or reads. The repeated data operations can lead to breakdown or wearing of the structure electrically isolating the floating gate or the charge trap (e.g. the oxide layers). In accounting for the changing electrical characteristics of the memory cells 122, the memory device 102 can shift or calibrate the read level voltage 158.

The programming level voltage 160 is associated with the read level voltage 158 and the threshold voltage 156. The programming level voltage 160, the read level voltage 158, the threshold voltage 156 or a combination thereof can correspond to the number of bits stored in the memory cells 122, the specific content value of the data stored in the memory cells 122, or a combination thereof.

For example, memory cells 122 configured to store charge in one of two possible states (e.g., SLC memory cells) may have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage 160, the read level voltage 158, the threshold voltage 156, or a combination thereof can be associated with each of the possible data values.

The memory device 102 can iteratively store charge in the memory cells 122 for the write or program operation, such as for incremental step pulse programming (ISPP). The programming step 162 can include an increment or a voltage value for increasing the stored charge in each iteration. The memory device 102 can reach the programming level voltage 160 by incrementally storing or increasing amounts of charge corresponding to the programming step 162.

Figure 2:
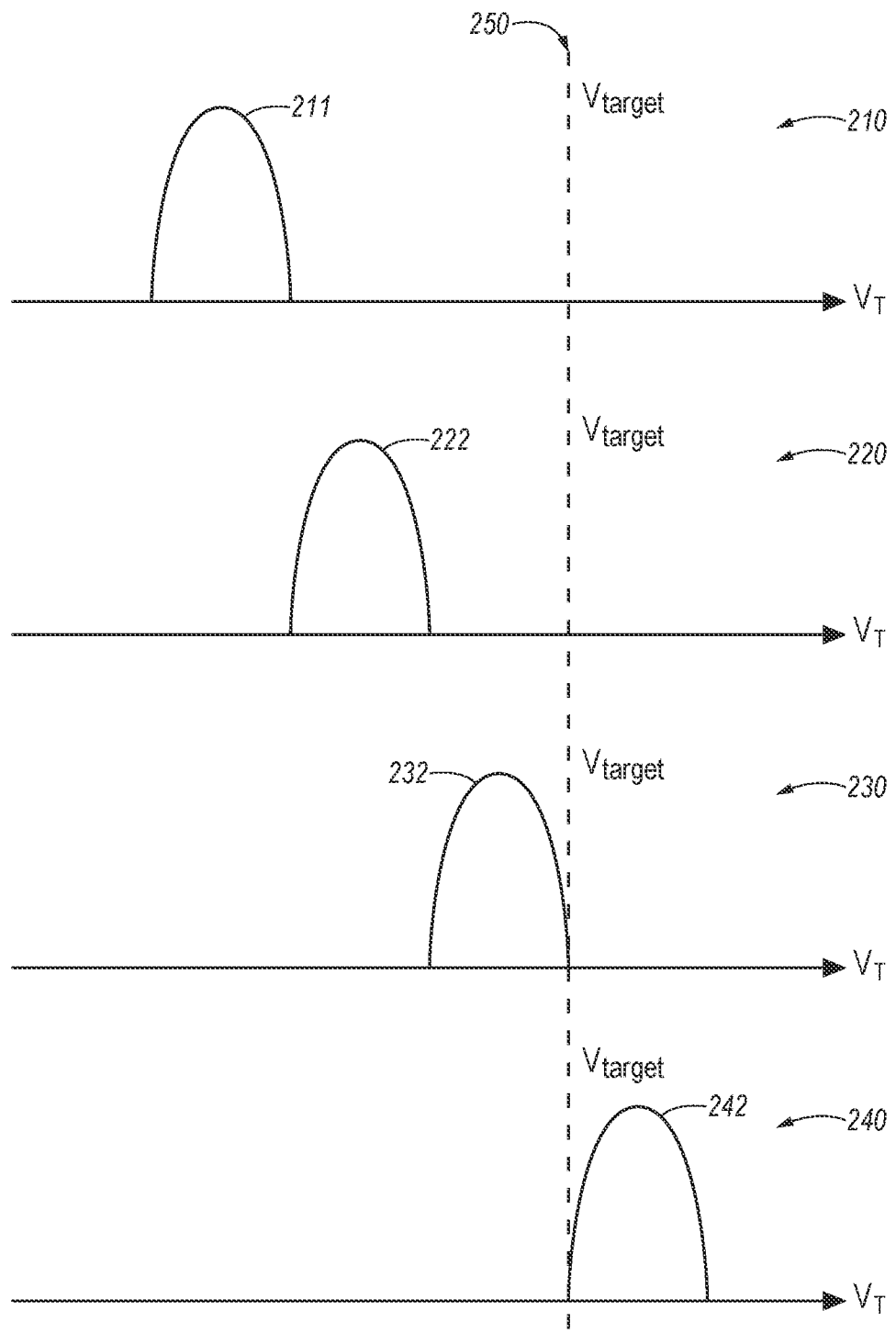
FIG. 2 illustrates the charge stored on the charge storage structure of a memory cell at various states of an incremental programming operation.

For example, FIG. 2 illustrates the charge stored on the charge storage structure of a memory cell at various states of one such incremental programming operation. The charge 211 stored on the memory cell at time 210 is below a desired target state 250 when the incremental programming operation begins. To program the memory cell to the desired target state 250, a series of programming steps 162 can be used at each of time 220, 230 and 240 to increase the charge stored on the cell's charge storage structure to charges 222, 232 and 242, respectively. After each programming step 162, the charge stored on the charge storage structure can be verified to determine whether it has reached the desired target state 250. At time 240, as the charge 241 has been increased the desired target state 250, the programming operation is completed.

For programming more significant bits to a cell that already has been programmed with less significant bits, the number of programming steps 162 (and verification steps) used in a programming operation may be larger (e.g., due to the addition of a smaller increment of charge with each programming pulse), such that programming more significant bits to a cell can take more time and energy than programming less significant bits.

The processing levels 154 can be stored in the memory device 102, the host device 108, or a combination thereof. For example, the memory device 102 can include one or more level registers 164 on the controller 106, the memory array 104, another memory location of the memory device 102, or a combination thereof for storing the processing levels 154. The level registers 164 can store the threshold voltage 156, the read level voltage 158, the programming level voltage 160, the programming step 162, or a combination thereof. The memory system 100, controller 106, and/or the host 108 can access the level registers 164, write or adjust the values in the level registers 164, or a combination thereof. Similarly, the processing levels 154 can be stored in the embedded memory of the controller 106, the memory array 104, another memory location of the memory device 102, or a combination thereof.

The memory device 102 can further process errors associated with storage or access of the data. The errors can correspond to a bit or a unit of bits, such as for a code-word, for a page, or for a block, that may be introduced during erase, program or write, or read operations. In addition to the data processing, data retention can further introduce retention error. Other sources of errors can include process variations, defects, electrical coupling or parasitic capacitance-coupling, changes in characteristics or capabilities of the circuitry or components therein, or a combination thereof.

The memory device 102 can track an error measure 166. The error measure 166 can represent a degree, a frequency, an amount or magnitude, a size or number, a processing derivation of the errors, or a combination thereof describing the errors. For example, the error measure 166 can include an error count 168, an error rate 170, or a combination thereof. The error count 168 can represent an amount or magnitude, a degree, a size or number, or a combination thereof describing the errors. For example, the error count 168 can be a bit error count (BEC). The error rate 170 can represent a frequency or a probability of occurrence of the errors, a proportional amount or a percentage of errors, or a combination thereof. For example, the error rate 170 can include a bit error rate (BER). The error measure 166 can correspond to one or more units or groupings within the memory array 104. For example, the error measure 166 can be for one or more of the memory pages 124, the memory cells 122, the word-line group 144, a die, or a combination thereof. Also for example, the error measure 166 can correspond to the page type 146, such as for the lower page 148, the upper page 150, or the extra page 152. The error measure 166 can be calculated or tracked by the host device 108, the controller 106, or a combination thereof. The error measure 166 can be stored in the host device 108, the embedded memory of the controller 106, the memory array 104, another memory location of the memory device 102, or a combination thereof.

The memory system 100 can utilize an error recovery mechanism 172 to detect and/or correct the errors. The memory system 100 can implement the error recovery mechanism 172 using the host device 108, the controller 106, the memory array 104, or a combination thereof. The error recovery mechanism 172 can include a process, function, circuitry, or a combination thereof for detecting the errors in the stored or accessed data, and further for correcting the error and recover the original intended data. In-line corrections and overall data recovery, such as based on or for one or more code-words, can be examples of the error recover mechanism 172. Also for example, the error recovery mechanism 172 can utilize an error correcting code (ECC) for the code-words, such as Hamming code, low-density parity-check (LDPC) code or Bose-Chauduri-Hocquenghem (BCH) code, to detect and/or correct the error.

The memory system 100 can further generate and maintain background records 174. The background records 174 can include information describing a history for the memory device 102. For example, the background records 174 can track the errors, the error rate 170, usage or implementation of the error recovery mechanism 172, corresponding description or context data, a processing result or a representation thereof, or a combination thereof. Also for example, the background records 174 can track processing results, such as data, levels, results, statistical representation thereof, or a combination thereof associated with dynamic calibration for various different aspects or operations of the memory device 102. The background records 174 can be tracked using the controller 106, the host device 108, or a combination thereof. The background records 174 can be stored in the memory array 104, the embedded memory of the controller 106, another memory location of the memory device 102, the host device 108, or a combination thereof.

The memory system 100 can dynamically calculate or adjust the processing levels 154 based on feedback information. For example, the memory system 100 can continuously update the read level voltage 158 using a processing-level calibration mechanism 176. Also for example, the memory system 100 can dynamically update or adjust the programming step 162 using a step calibration mechanism 180. Further, the memory system 100 can dynamically generate or adjust distribution targets representing histogram showing the number of memory cells having particular measured value (e.g. a threshold voltage level) corresponding to specific logical values. The measured values can shift due to the breakdown in the oxide layer. The memory system 100 can dynamically adjust the distribution targets based on feedback data using a target calibration mechanism 178 to adjust for the shift in the measured values. The processing-level calibration mechanism 176, the target calibration mechanism 178, and the step calibration mechanism 180 can each be a unique process, method, function, circuitry, configuration, or a combination thereof for implementing the above mentioned calibrations. Details regarding the processing-level calibration mechanism 176, the target calibration mechanism 178, and the step calibration mechanism 180 are discussed below.

Figure 3C:
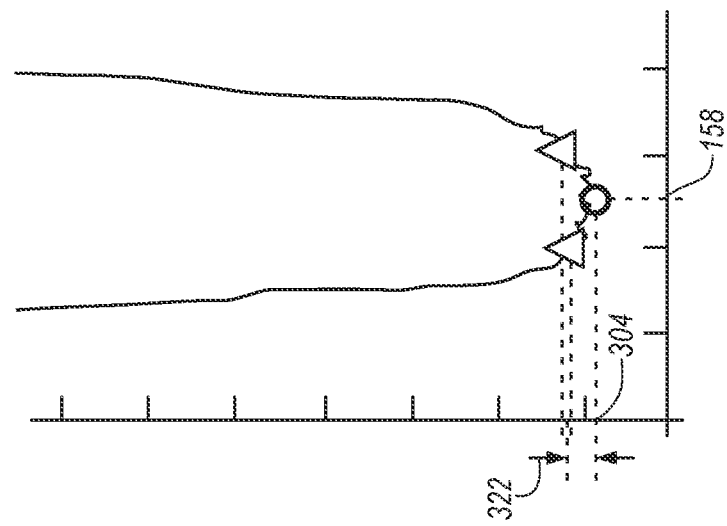
FIGS. 3A, 3B and 3C illustrate an example of a progression for the processing-level calibration mechanism in FIG. 1.
Figure 3B:
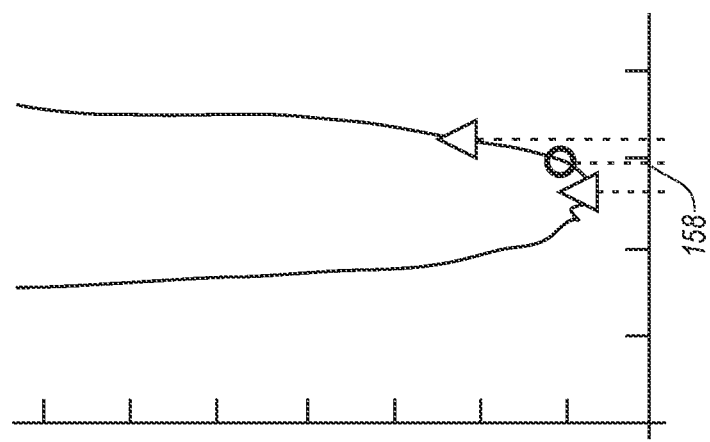
Figure 3A:
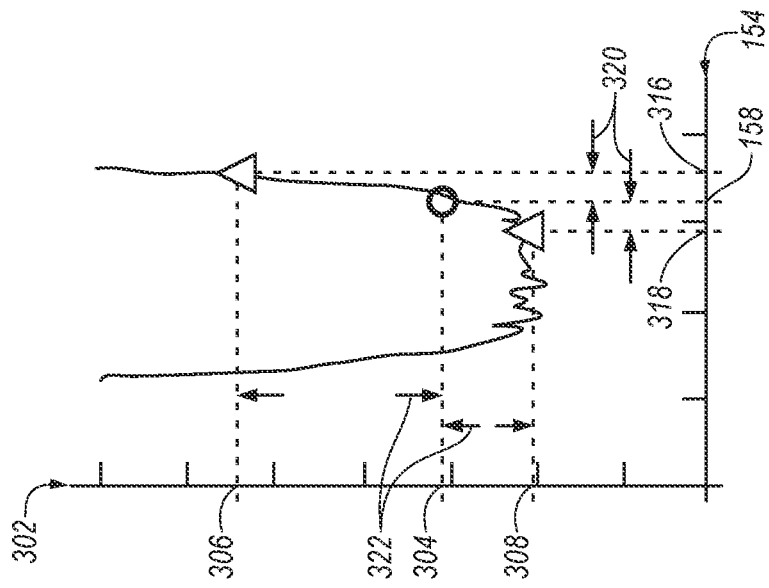

FIGS. 3A, 3B, and 3C show charts correlating the error count (shown along the Y-axis) of a memory page with the read voltage (shown along the X-axis) used to read the data from the cells. FIGS. 3A, 3B and 3C show a progression for the processing-level calibration mechanism 176 (FIG. 1). The processing-level calibration mechanism 176 can adjust the read level voltage 158 to reduce the error count 168 as illustrated in FIG. 3A through FIG. 3C. While the figures illustrates an embodiment in which the calibration mechanism uses a measured error count to calibrate a read level voltage, the present technology may be used, in other embodiments, to similarly calibrate other processing levels (e.g., program voltage, threshold level, etc.) in view of other measured characteristics (bit error rate, etc.).

For illustrative purposes, the processing-level calibration mechanism 176 is described below using the read level voltage 158. However, it is understood that the processing-level calibration mechanism 176 can be implemented for the threshold voltage 156 (FIG. 1), the programming level voltage 160 (FIG. 1), the programming step 162 (FIG. 1), or a combination thereof.

FIGS. 3A through 3C illustrate sequential changes, adjustments, or calibrations in the read level voltage 158 and the corresponding samples and results as the processing-level calibration mechanism 176 is implemented. The memory system 100 (FIG. 1) can implement the processing-level calibration mechanism 176 including iterative changes, adjustments, or calibrations in the read level voltage 158. The memory system 100 can further implement the processing-level calibration mechanism 176 multiple times over a duration to iteratively adjust the read level voltage 158.

FIG. 3A shows an example behavior prior to or in the absence of implementing the processing-level calibration mechanism 176. In initiating or implementing the processing-level calibration mechanism 176, the memory system 100 can use one or more of the components therein to sample data and generate or update a test measurement set. The test measurement set can include a center result 304, a first offset result 306, a second offset result 308, other results, or a combination thereof. The memory system 100 can generate or update the test measurement set based on determining results corresponding to a set of read operations using the read level voltage 158 or using a voltage offset from the read level voltage 158.

For example, the memory system 100 can determine the center result 304 based on determining the error count 168 corresponding to data read or accessed using the read level voltage 158 for a particular page type of an instance of the memory pages 124 (FIG. 1). The center result 304 corresponding to original, unadjusted, or uncalibrated instance of the read level voltage 158 is represented as "O" in FIG. 3A.

The memory system 100 can similarly determine the first offset result 306 based on determining the error count 168 corresponding to data read or accessed using a first offset level 316. The memory system 100 can similarly determine the second offset result 308 based on determining the error count 168 corresponding to data read or accessed using a second offset level 318. The first offset level 316 is indicated by the vertical dotted line leading from the x-axis up to the plot. The corresponding location of the plot is shown as a triangle located to the right and above the center result 304 in FIG. 3A. The second offset level 318 is indicated by the vertical dotted line leading from the x-axis to the plot with the corresponding location on the plot located to the left and below the center result 304 in FIG. 3A.

The first offset level 316 and the second offset level 318 can each be a voltage level for reading or accessing data stored in corresponding instances of the memory cells 122 (FIG. 1). The first offset level 316 and the second offset level 318 can be values different from each other and different from the read level voltage 158. For example, the first offset level 316 can be greater than the read level voltage 158. Also for example, the second offset level 318 can be lesser than the read level voltage 158.

Also for example, the first offset level 316, the second offset level 318, or a combination thereof can be offset from the read level voltage 158 by an offset measure 320. The offset measure 320 can represent a separation or an offset amount from the read level voltage 158 for one or more of the offset levels. The offset measure 320 can further represent a direction or a sign, a degree or a magnitude, or a combination thereof for the separation or the offset.

The memory system 100 implementing the processing-level calibration mechanism 176 can select a die, a memory block, a memory page, a trim or the read level voltage 158 corresponding to one page type for the page, or a combination thereof. The selection can be random. Further, the selection can occur as part of an iterative process. Details regarding the selections are discussed below. Following the selection, the memory system 100 can sample at least the center result 304, the first offset result 306 and the second offset result 308 for the test measurement set. The memory system 100 can use the first offset level 316 and the second offset level 318 both offset from the read level voltage 158 by the offset measure 320 in opposite directions. The memory system 100 can use the center result 304, the first offset result 306 and the second offset result 308 to adjust or calibrate the read level voltage 158.

The memory system 100 can adjust, update, or calibrate the read level voltage 158 based on comparing or balancing the various results. The memory system 100 can further calibrate the read level voltage 158 based on adjusting or updating the offset measure 320. The memory system 100 can dynamically further calibrate the read level voltage 158. The memory system 100 can additionally calibrate the read level voltage 158 using the processing-level calibration mechanism 176 during or as part of manufacture, configuration, or set up of the memory device 102 (FIG. 1), before intended deployment or usage thereof. Details regarding the processing-level calibration mechanism 176 are discussed below.

FIG. 3B illustrates the read level voltage 158 that has been adjusted or calibrated in comparison to the read level voltage 158 illustrated in FIG. 3A. FIG. 3B can represent an iteration during implementation of the processing-level calibration mechanism 176 or an implementation of the processing-level calibration mechanism 176 before the read level voltage 158 has settled or centered along the plot. The read level voltage 158 is illustrated in FIG. 3B as being lower or further left than in FIG. 3A. However, it is understood that the read level voltage 158 can be adjusted in any direction and by any increments or values. The processing-level calibration mechanism 176 can adjust the read level voltage 158 to decrease error rates or counts for the corresponding memory cells 122, such as according to current condition or characteristics of the memory cells 122.

The read level voltage 158 can be calibrated in a variety of ways. For example, the read level voltage 158 can be incremented or shifted by a predetermined amount or increment based on comparing or balancing the various results. Also for example, the read level voltage 158 can be assigned a predetermined value corresponding to one or more results of the sampling process. Also for example, the read level voltage 158 can be replaced by the first offset level 316 or the second offset level 318 based on one or more of the results. Details regarding the calibration of the read level voltage 158 are discussed below.

Once the read level voltage 158 has been calibrated, the memory system 100 can repeat the process. For example, the memory system 100 can use the updated, adjusted, or calibrated instance of the read level voltage 158 to calculate new offset levels, or a combination thereof for latter or subsequent iterations or implementations of the processing-level calibration mechanism 176. Results can be processed, and the read level voltage 158 can further be calibrated accordingly. The process can repeat until the read level voltage 158 and the corresponding results satisfy a stop or a break condition. For example, the process can stop when the read level voltage 158 corresponds to estimated minimum instance of the error count 168, corresponding to a minimum point or a center point along a plot correlating error counts to read levels as illustrated in FIG. 3A through FIG. 3C.

FIG. 3C can illustrate the example behavior after implementation of the processing-level calibration mechanism 176 or for subsequent or latter implementations of the processing-level calibration mechanism 176. As illustrated, implementation of the processing-level calibration mechanism 176 can adjust or calibrate the read level voltage 158 to be located at or within a threshold distance from a bottom or minimum of the plot correlating error counts to read levels. The processing-level calibration mechanism 176 utilizing the center result 304 corresponding to the read level voltage 158 and the one or more offset results corresponding to respective results provides the benefit of reducing errors introduced by reads. The processing-level calibration mechanism 176 can find the read level voltage 158 that reduces read errors based on iteratively testing different possible values of the read level voltage 158 and compare the corresponding error counts.

The memory system 100 can further calculate an error-difference measure 322. The error-difference measure 322 is a comparison between the center result 304 and one or more of the offset results. The error-difference measure 322 can be a separation or a difference in the error count 168 between a combination of the results including the center result 304, the first offset result 306, and the second offset result 308. For example, the memory system 100 can calculate the error-difference measure 322 as a difference between the center result 304 and an average value of the first offset result 306 and the second offset result 308. Also for example, the memory system 100 can calculate the error-difference measure 322 based on a measure of difference between the center result 304 and the first offset result 306, the second offset result 308, or a combination thereof. The error-difference measure 322 can be a feedback measure for one or more mechanisms. For example, a level-calibration feedback measure 302 (i.e., a value, result, metric, or a combination thereof further utilized as input for calibrating one or more of the processing levels 154) can include the error-difference measure 322. Also for example, the error-difference measure 322 can be the feedback measure for implementing the target calibration mechanism 178 (FIG. 1), the step calibration mechanism 180 (FIG. 1), or a combination thereof. Details regarding the error-difference measure 322 are discussed below.

Figure 4A:
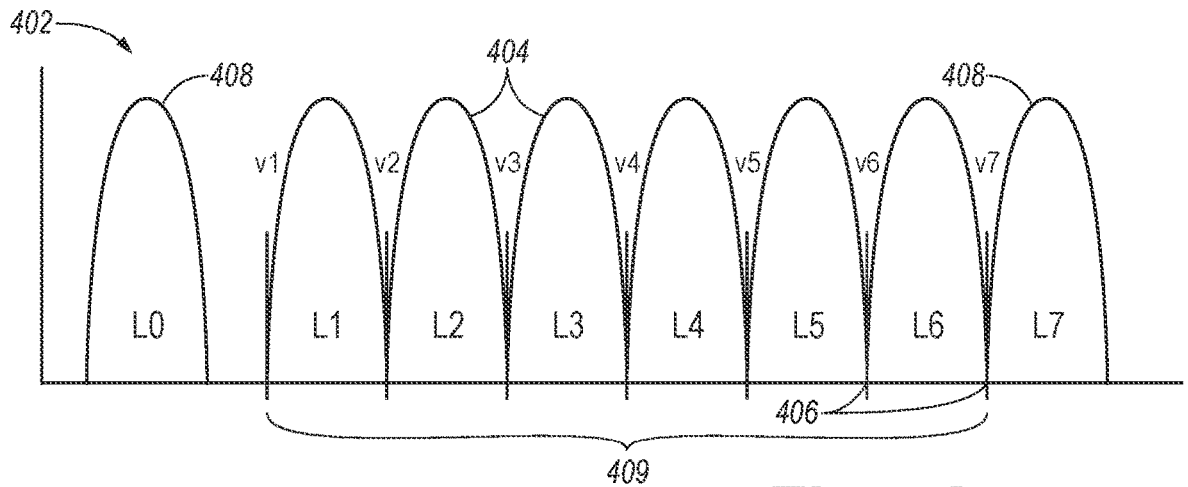
FIGS. 4A, 4B and 4C illustrate an example of a progression for the target calibration mechanism in FIG. 1.
Figure 4B:
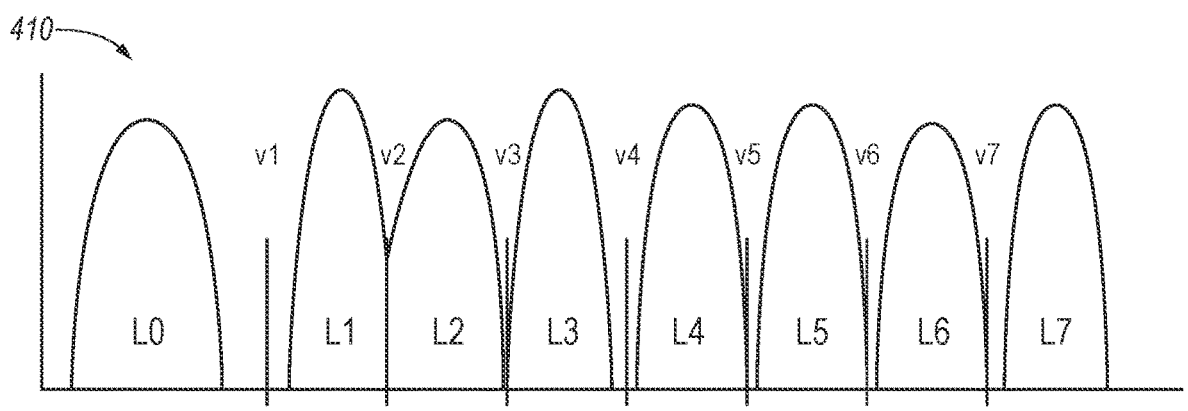
Figure 4C:
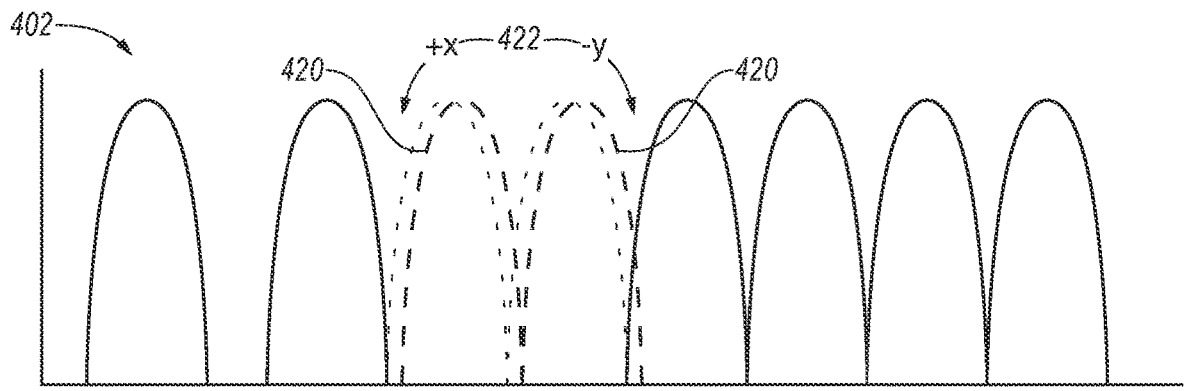

FIGS. 4A, 4B and 4C show a progression for the target calibration mechanism 178 (FIG. 1). The target calibration mechanism 178 can adjust a desired distribution of program-verify levels according to the current behavior of the memory cells. FIGS. 4A, 4B and 4C correspond to a TLC page including or corresponding to the lower page 148, the upper page 150, and the extra page 152, (all shown in FIG. 1). The example illustrations represent a number of occurrences for a specific trim level along a vertical direction or axis. The example illustrations show voltage levels along a horizontal direction or axis.

FIG. 4A shows an example of a target profile 402 for the memory system 100 (FIG. 1). The target profile 402 is an objective or a desired result for a number of occurrences of the processing levels 154, such as the threshold voltage 156 or the read level voltage 158, (all FIG. 1), for a given set of the memory cells 122 (FIG. 1), such as for a page, a logical or stored value, a word-line group, a word line, a die, or a combination thereof. For example, the target profile 402 can include program-verify (PV) target, a desired gray code distribution, a desired write distribution, or a combination thereof.

The memory system 100 can utilize the target profile 402 to control behaviors, operations, or processes of the memory device 102 (FIG. 1). The target profile 402 can specify a desired or targeted amount or quantity of the processing levels 154 (FIG. 1) corresponding to the voltage levels, the page type 146 (FIG. 1), or a combination thereof. The memory system 100 can further adjust or calibrate the target profile 402 using the target calibration mechanism 178 (FIG. 1). The target profile 402 can include a distribution target 404 for each logical value or corresponding voltage levels. The distribution target 404 can correspond to a set of desired quantities or occurrences of the processing levels 154 corresponding to a specific content value, the page type 146, or a combination thereof. Each instance of the distribution target 404 can correspond to one unique instance of the possible content values. The voltage levels corresponding to the distribution target 404 can represent a satisfactory or desired range for the processing levels 154 for the corresponding data value.

For TLC pages, such as exemplified in FIGS. 4A-4C, each of the memory cells 122 can store three bits. Storage of three bits can equate to eight possible content values of 0-7 or bit values of "000", "001", "010", "011", "100", "101", "110", and "111". Each of the possible content values is identified with level identification, such as L0-L1, in FIGS. 4A-4C. The assignment of the bit values to specific voltage ranges can be predetermined by the memory system 100, a developer or a manufacturer, a standard or a template, or a combination thereof. The target profile 402 can further include or represent a distribution valley 406. The distribution valley 406 is a representation of a relationship between adjacent distribution targets. The distribution valley 406 can represent an intersection, a separation, an overlap, or a combination thereof between two adjacent distribution targets. The distribution valleys 406 can each be between, at the boundary of, or a combination thereof between two adjacent instances of the distribution target 404. The distribution valley 406 can be where one or more of the distribution target 404 cross a threshold level or quantity, where multiple target levels meet or overlap, or a combination thereof.

For TLC pages, such as exemplified in FIGS. 4A-4C, there can be 8 valleys. Each of the distribution valleys 406 are identified with valley identification, such as v1-v7, in FIGS. 4A-4B (not shown in FIG. 4C). Each valley can correspond to a unique division or threshold for the lower page 148, the upper page 150, and the extra page 152, which can be utilized to determine the content stored in the corresponding cells. Each of the distribution valleys 406 can be for determining the lower page 148, the upper page 150, the extra page 152, the bit value at the corresponding location, or a combination thereof. The assignment or correlation between the distribution valleys 406 and the unique values and/or the page type 146 can be based on a predetermined order, sequence, arrangement, or a combination thereof for the various bit value assignments.

The memory system 100 can use edge targets 408 as reference points and dynamically adjust middle targets 409. The edge targets 408 represent instances of the distribution targets 404 corresponding to lowest and highest voltage levels. The middle targets 409 include instances of the distribution targets 404 between the edge targets 408. The memory system 100 can implement the target calibration mechanism 178 to adjust or balance the middle targets 409 or the corresponding distribution valleys 406.

FIG. 4B shows a level distribution profile 410. The level distribution profile 410 can be a histogram showing a number of memory cells 122 having a particular measured value (e.g., the threshold voltage 156 of FIG. 1). The level distribution profile 410 can represent an actual count or a current state of the memory cells 122. The target profile 402 can be for controlling or adjusting processes or levels to control or manage the level distribution profile 410. For example, the level distribution profile 410 can include actual program-verify states, actual gray code distribution, actual write distribution, or a combination thereof. The memory system 100 can determine and track various information for the level distribution profile 410. The level distribution profile 410 can change over time and usage. The level distribution profile 410 can further deviate from the target profile 402 due to the change, corresponding updates or changes to the processing levels 154, or a combination thereof. The memory system 100 can adjust or calibrate the target profile 402 accordingly with the target calibration mechanism 178.

FIG. 4C illustrates the adjustment, update, or calibration of the target profile 402. The memory system 100 implementing the target calibration mechanism 178 can generate one or more adjusted targets 420 for replacing previous targets. In FIG. 4C, the previous targets, such as initially illustrated in FIG. 4A, are shown using dotted lines, and the adjusted targets 420 are shown using dashed lines. The memory system 100 can generate the adjusted targets 420 based on shifting or moving one or more previous targets higher or lower in voltage level, such as left or right as illustrated in FIGS. 4A-4C. The memory system 100 can generate the adjusted targets 420 based on target adjustment values 422. The target adjustment values 422 can represent a direction, an amount or magnitude, or a combination there of for the change in the voltage level for the corresponding distribution target 404. The target adjustment values 422 can further correspond to changes in depth, magnitude, degree or amount, or a combination thereof for the corresponding distribution valley 406. The memory system 100 can implement the target calibration mechanism 178 and adjust the target profile 402 to balance the distribution targets 404, the distribution valleys 406, or a combination thereof across the various bit values. Details regarding the error-difference measure 322 and the target calibration mechanism 178 are discussed below.

The error-difference measure 322 provides a quantified representation of a depth or a magnitude for the distribution valleys 406 and the corresponding RWB. The target calibration mechanism 178 utilizing the error-difference measure 322 as a feedback measure to adjust or balance one or more instances of the distribution target 404 provides the benefit of even usage and wear of the memory device 102, thereby extending the life of the memory cells 122.

Figure 5A:
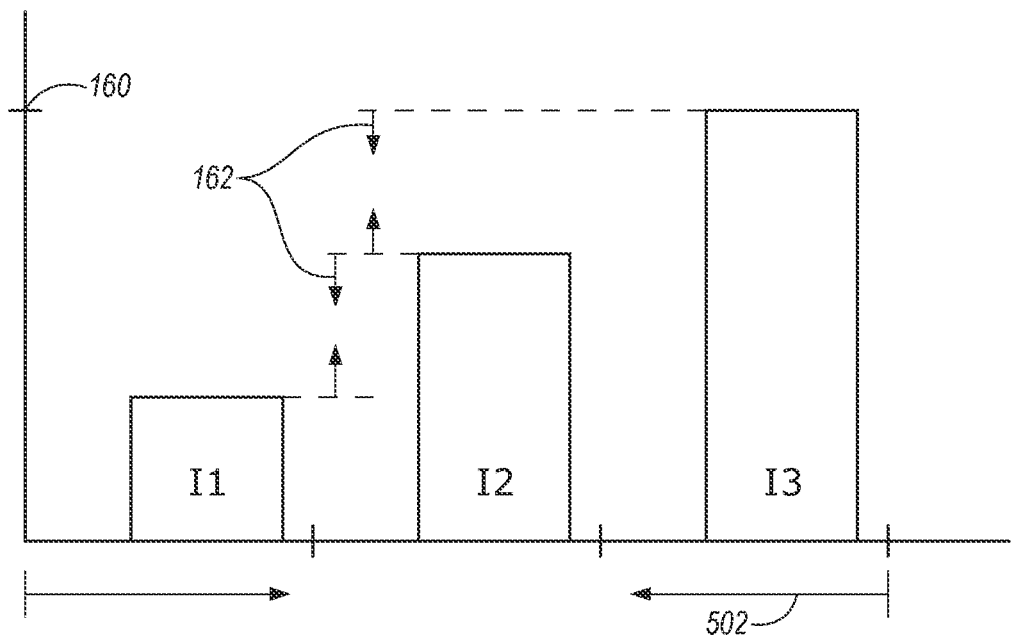
FIGS. 5A and 5B illustrate an example of a progression for the target calibration mechanism in FIG. 1
Figure 5B:
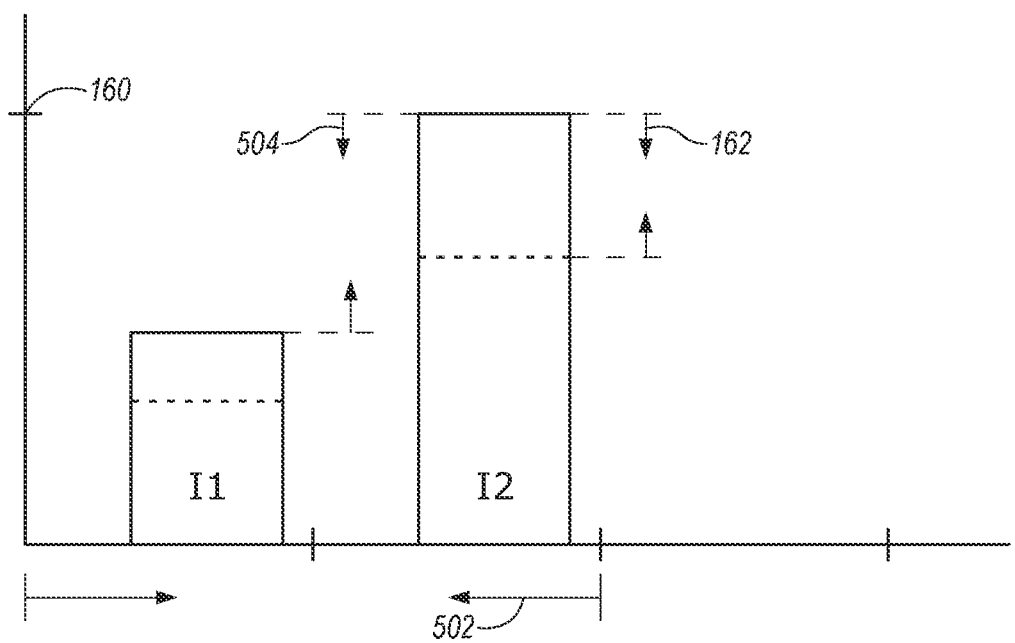

FIGS. 5A and 5B are example illustrations of progression for the step calibration mechanism 180 (FIG. 1). The example illustrations represent an amount of charge stored in the memory cell along a vertical direction or axis. The example illustrations show time along a horizontal direction or axis.

FIG. 5A illustrates a programming operation for a memory cell before implementing the step calibration mechanism 180 (FIG. 1). The memory system 100 (FIG. 1) can program or write by storing a targeted amount of charge in the memory cell, where the targeted magnitude or level represents specific content or bit value. The memory system 100 can program or write by storing an amount of charge the programming level voltage 160 (FIG. 1). The memory system 100 can program or write by storing incremental amounts of charge into the memory cell in an iterative process, such as for ISPP. For example, the memory system 100 can iteratively apply multiple pulses for increasing the charge stored in the memory cell. The memory system 100 can use the programming step 162 to incrementally increase the stored charge until the stored magnitude or level matches the programming level voltage 160. The memory system 100 can program and verify for each pulse or iterations. The iterations are illustrated as 11', 12' and 13' for FIG. 5A.

A programming time 502 is a duration associated with reaching the programming level voltage 160. The programming time 502 can be associated with a number of iterations needed to reach the programming level voltage 160, the programming step 162 utilized for each iteration, or a combination thereof. The memory system 100 can implement the step calibration mechanism 180 to dynamically adjust or calibrate the programming step 162. The memory system 100 can dynamically increase or decrease the programming step 162, which will correspondingly increase or decrease the programming time 502. Details regarding the step calibration mechanism 180 are discussed below.

FIG. 5B illustrates the programming operation after implementing the step calibration mechanism 180 (FIG. 1). For comparison, the previous levels and steps, such as in FIG. 5A, are illustrated with dotted lines. The step calibration mechanism 180 can generate an adjusted step 504. The adjusted step 504 is a calibrated or changed instance of the programming step 162 for replacing the programming step 162. The adjusted step 504 can be greater or lesser than the programming step 162.

Dynamically generating the adjusted step 504 to increase the programming step 162 provides the benefit of decreased programming time 502. The increase in the programming step 162 can reduce the number of pulses or iterations required to reach the programming level voltage 160, thereby reducing the corresponding amount of time. Thus, the dynamically calibration and adjustment of the programming step 162 improves overall efficiency for the memory system 100.

Moreover, the adjusted step 504 can be generated based on a feedback measure, or a processing result thereof, representing a trigger or an implementation for the error recovery mechanism 172 (FIG. 1). The consideration of triggering the error recovery mechanism 172 in generating the adjusted step 504 provides the reduction in the programming time 502 without increasing the error measure 166 (FIG. 1). Details regarding the step calibration mechanism 180 are discussed below.

Figure 6:
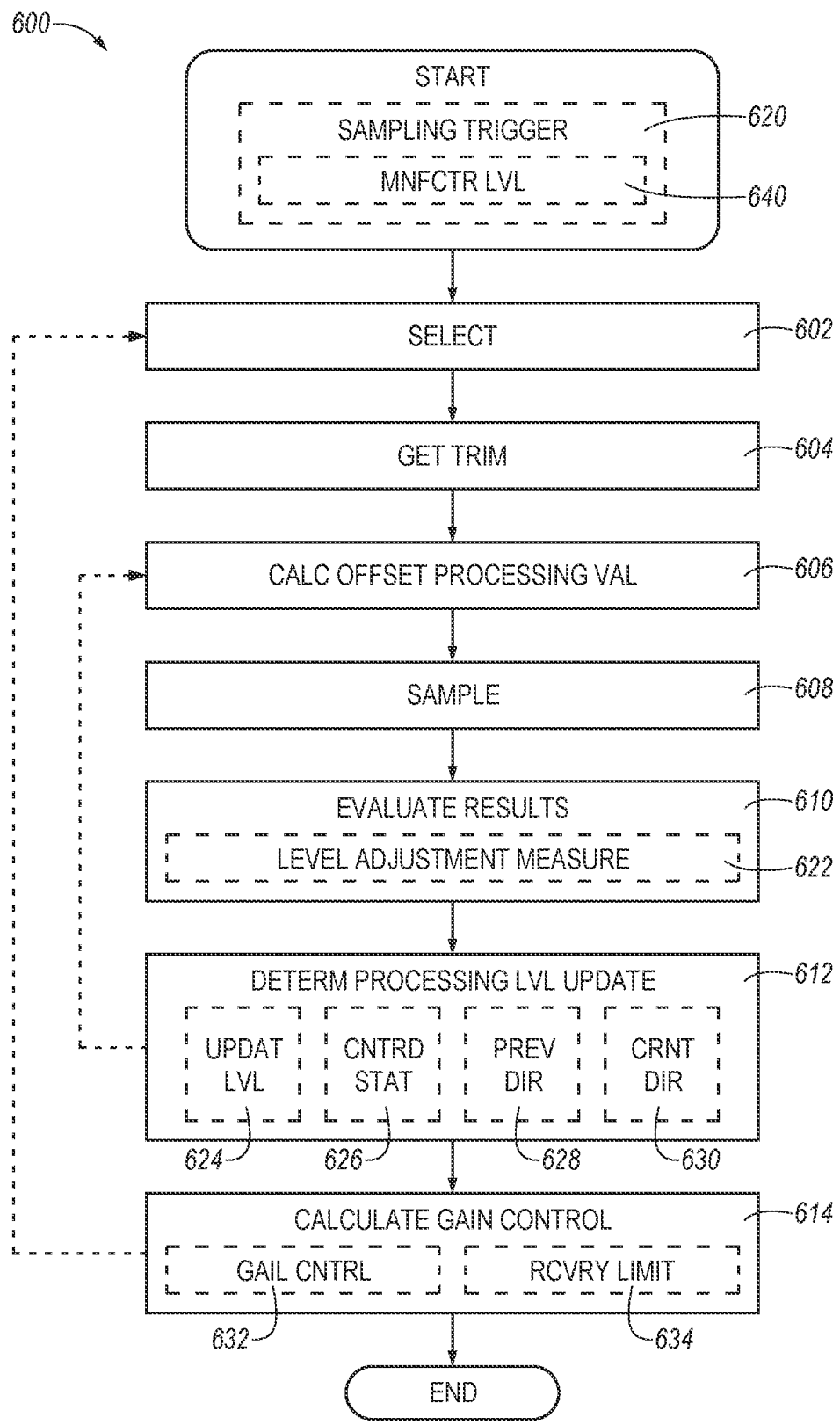
FIG. 6 is a flow diagram illustrating an example method of operating the memory system in FIG. 1 in accordance with an embodiment of the present technology.

FIG. 6 is a flow diagram illustrating an example method 600 of operation for the memory system 100 (FIG. 1) in accordance with embodiments of the present technology. The method 600 can include implementation of the processing-level calibration mechanism 176 (FIG. 1). The processing-level calibration mechanism 176 can be executed or implemented, for example, by a processing circuitry for the memory device 102 or the host device 108, such as the controller 106, the memory array 104, processor for the host device 108, a portion therein or a combination thereof (all FIG. 1). The processing-level calibration mechanism 176 can include the configuration of the controller 106, the memory array 104, the host device 108, or a combination thereof. The processing-level calibration mechanism 176 can further include, one or more methods, processes, steps or instructions, information, or a combination thereof stored within or accessed using the controller 106, the memory array 104, the host device 108, or a combination thereof.

The processing-level calibration mechanism 176 can be utilized or implemented to adjust the processing levels 154 (FIG. 1), such as for the read level voltage 158 (FIG. 1). The processing-level calibration mechanism 176 can begin based on determining or identifying a sampling trigger 620. The sampling trigger 620 can represent a state, a signal, a configuration, or a result utilized to cue or begin the processing-level calibration mechanism 176. For example, the sampling trigger 620 can include a signal or a command from the host device 108 (FIG. 1), such as an interrupt service routine. Also for example, the sampling trigger 620 can include a specific state of the memory device 102, the memory system 100, or a combination thereof, such as for power on or off. Also for example, the sampling trigger 620 can include a specific number of operations or processes, a time of day, or a combination thereof.

At block 602, the processing-level calibration mechanism 176 can select a fully-programmed one of the memory pages 124 (FIG. 1) for a grouping of the memory cells 122 (FIG. 1) for processing. The selected page can correspond to one or more page types based on the type of cells, such as for SLC, MLC, and TLC. The selected page can further correspond to one of the word-line groups 144 and a word line. The selection can be made randomly, iteratively, or a combination thereof. Overall, the page selection can be random based on randomly selecting one of the memory blocks 126 (FIG. 1) within each die for each outer iteration. Further, the memory system 100 can select one of the memory blocks 126 that is fully programmed. The selection of the grouping of memory cells 122 can be done in a variety of ways.

For example, the memory system 100 can randomly select one of the memory pages 124 based on randomly selecting one of the memory blocks 126 including the memory page. The memory system 100 can iteratively sample the selected page 124 with the read level voltage 158 corresponding to the lower page 148 (FIG. 1), the upper page 150 (FIG. 1), the extra page 152 (FIG. 1), or a combination thereof available for the corresponding word-line group. The memory system 100 can thus select such that all trims or processing levels 154 of all page types for each word-line group can be sampled for the same pages. Also for example, the memory system 100 can randomly select a page based on randomly selecting one of the memory blocks 126 including the selected page. Once the block is selected, the page can be randomly selected for each sampling process. In other words, the processing-level calibration mechanism 176 can select such that trims of different page types of each word-line group can be sampled for random pages.

At block 604, the processing-level calibration mechanism 176 can get the trim or determine one or more of the processing levels 154 corresponding to the memory page 124. For example, the controller 106, the host device 108, or a combination thereof can access the level register 164 (FIG. 1) to get the trim or to determine the one or more of the processing levels 154. As a more specific example, the controller 106 can determine the read level voltage 158 corresponding to the lower page 148, the upper page 150, the extra page 152, or a combination thereof for accessing the stored information according to the selected page.

At block 606, the processing-level calibration mechanism 176 can provide one or more offset processing values. For example, the controller 106, the host device 108, or a combination thereof can calculate the first offset level 316 (FIG. 3), the second offset level 318 (FIG. 3), or a combination thereof based on the read level voltage 158 and the offset measure 320 (FIG. 3). As a more specific example, the controller 106 can access the offset measure 320 stored in the embedded memory therein, received from the host, stored on the memory array 104, or a combination thereof. The controller 106 can calculate the first offset level 316 based on adding the offset measure 320 to the read level voltage 158, or based on shifting in one direction according to the offset measure 320 from the read level voltage 158. The controller 106 can further calculate the second offset level 318 based on subtracting the offset measure 320 to the read level voltage 158, or based on shifting in an opposite direction according to the offset measure 320 from the read level voltage 158.

At block 608, the processing-level calibration mechanism 176 can sample according to one or more levels. For example, the controller 106, the host device 108, or a combination thereof can determine one or more results corresponding to the one or more of the processing levels 154 or the offsets thereof, such as the read level voltage 158 along with the first offset level 316, the second offset level 318, or a combination thereof.

As a more specific example, the controller 106, the host device 108, or a combination thereof can determine the center result 304 (FIG. 3) using the read level voltage 158 for processing the data corresponding to the memory cells 122 of the selected page. The memory system 100 can read the stored data using the center result 304. The memory system 100 can implement an error correction/detection mechanism on the accessed data using the ECC to process any errors corresponding to the read level voltage 158. The memory system 100 can determine the error count 168 (FIG. 1) corresponding to the read level voltage 158 to determine the center result 304.

Continuing with the example, the memory system 100 can similarly calculate the error count 168 corresponding to the first offset level 316, the second offset level 318, or a combination thereof. The memory system 100 can determine the first offset result 306 (FIG. 3) as the error count 168 resulting from the data accessed using the first offset level 316. The memory system 100 can determine the second offset result 308 (FIG. 3) as the error count 168 resulting from the data accessed using the second offset level 318. The memory system 100 can perform 4 reads from the same read threshold valley or same MLBi trim register.

The memory system 100 can store one or more error counts or results, corresponding levels, or a combination thereof. The memory system 100 can store the center result 304, the first offset result 306, the second offset result 308, the corresponding processing levels, or a combination thereof in the embedded memory of the controller 106, the memory array 104, the host device 108, or a combination thereof.

At block 610, the processing-level calibration mechanism 176 can evaluate the results for adjusting or calibrating the processing levels 154. For example, the memory system 100 can evaluate the results by calculating the level-calibration feedback measure 302 (FIG. 3) based on the center result 304, the first offset result 306, the second offset result 308, or a combination thereof. The memory system 100 can calculate the level-calibration feedback measure 302 including a level adjustment measure 622, the error-difference measure 322 (FIG. 3), or a combination thereof. The level-calibration feedback measure 302 can represent a greater value between the first offset result 306 and the second offset result 308, between difference values of the first offset result 306 and the second offset result 308 relative to the center result 304, or a combination thereof.

As a more specific example, the memory system 100 can determine the level adjustment measure 622 as an indication or a result based on comparing the center result 304, the first offset result 306, the second offset result 308, or a combination thereof. As a further specific example, the memory system 100 can determine the level adjustment measure 622 as a difference between the first offset result 306 and the second offset result 308, or as an indication of which of the first offset result 306 and the second offset result 308 is greater.

As a more specific example, the memory system 100 can calculate the error-difference measure 322 based on a combining two or more of the center result 304, the first offset result 306 and the second offset result 308. As a further specific example, the memory system 100 can calculate the error-difference measure 322 as a difference between the first offset result 306 and the center result, between the second offset result 308 and the center result 304, or a combination thereof.

Continuing with the example, the memory system 100 can also calculate the error-difference measure 322 as a difference between the center result 304 and a combination of the first offset result 306 and the second offset result 308, such as a mathematical derivation thereof, a logical combination thereof, or a statistical representation or an average thereof. The processing-level calibration mechanism 176 can include a method, an equation, a process, a circuit, or a combination thereof configured to calculate the error-difference measure 322 according to the error counts resulting from the sampling step represented in block 608.

At block 612, the processing-level calibration mechanism 176 can determine an update for the processing levels 154. The memory system 100 can generate an updated level 624 based on the various results. The updated level 624 is a new adjusted or calibrated value for the read level voltage 158. The updated level 624 can replace the previously used instance of the read level voltage 158. The memory system 100 can generate the updated level 624 in a variety of ways. For example, the controller 106, the host device 108, or a combination thereof can generate the updated level 624 based on the various results. As a more specific example, the memory system 100 can generate the updated level 624 as the read level voltage 158, the first offset level 316 or the second offset level 318 corresponding to the lowest instance of the error count 168. Also as a more specific example, the memory system 100 can generate the updated level 624 as a result of a weighted average of the read level voltage 158, the first offset level 316 and the second offset level 318. Each weighted average is based on the corresponding instance of the error count 168 or result.

Also for example, when more than one of the test levels result in same bit error rates, the memory system 100 can select the lower threshold value as the updated level 624. As a more specific example, if the read level voltage 158 and the lower offset level both correspond to the same error rate, the memory system 100 can select the lower offset level to be the updated level 624.

Also for example, the controller 106, the host device 108, or a combination thereof can generate the updated level 624 based on adjusting the processing level 154 according to the various results. The memory system 100 can generate the updated level 624 based on the level adjustment measure 622 and the read level voltage 158 utilized to generate the samples, such as by shifting or incrementing the read level voltage 158 according to the level adjustment measure 622.

Also for example, the controller 106, the host device 108, or a combination thereof can generate the updated level 624 based on the error-difference measure 322, such as by calculating the updated level 624 as a projection or an estimate of a level corresponding to the lowest estimated error count based on the various read levels and the corresponding error counts, historical or previous instances thereof, or a combination thereof. As a more specific example, the memory system 100 can utilize curve fitting or estimating functions, slope calculations, or a combination thereof to estimate the level corresponding to the minimum error count.

The memory system 100 can generate the updated level 624 for subsequently processing the data for the memory page 124. The memory system 100 can further generate the updated level 624 for balancing the first offset result 306 and the second offset result 308. The memory system 100 can generate the updated level 624 seeking to center the read level voltage 158 at the minimum error count as illustrated in FIG. 4B, thereby having the corresponding instances of the first offset result 306 and the second offset result 308 being similar in magnitude or within a threshold range of each other.

The memory system 100 can determine whether the processing levels 154 utilized for the sampling process is centered. For example, the memory system 100 can generate a centered status 626 based on a trend, a pattern, or a behavior of the read level voltage 158. The centered status 626 is a determination or a result indicating that the read level voltage 158 or an adjustment or update for the read level voltage 158 is at or near the minimum error count as illustrated in FIG. 3C.

The memory system 100 can generate the centered status 626 in a variety of ways. For example, the centered status 626 can indicate that the utilized read level voltage 158 is centered if the updated level 624 is the same or within a threshold amount than the read level voltage 158. Also for example, the centered status 626 can indicate that the read level voltage 158 previous to the current iteration is the lowest based on comparing the error counts or the results of the current iteration and the preceding or previous iteration. The centered status 626 indicates that the read level voltage 158, the updated level 624, or a combination thereof is at a targeted or desired instance of the processing levels 154.

Also for example, the memory system 100 can generate the centered status 626 based on a previous change direction 628 and a current change direction 630. The previous change direction 628 is a pattern, a trend, a behavior, or a combination thereof for preceding instances of the read level voltage 158. The previous change direction 628 can include a slope or a sign thereof for one or more instances of the read level voltage 158 prior to the current iteration. The memory system 100 can calculate the previous change direction 628 based on at least one previous instance of the processing levels 154 and current instance of the processing levels 154.

The current change direction 630 is a pattern, a trend, a behavior, or a combination thereof for current instance of the read level voltage 158, the updated level 624, or a combination thereof. The previous change direction 628 can include a slope or a sign thereof for the read level voltage 158 relative to a preceding instance of the read level voltage 158 or between the read level voltage 158 and the updated level 624. The memory system 100 can calculate the current change direction 630 based on the current read level voltage 158 and the updated level 624.

The memory system 100 can generate the centered status 626 based on comparing the current change direction 630 and the previous change direction 628. The memory system 100 can generate the centered status 626 when the current change direction 630 and the previous change direction 628 indicate a change in pattern or behavior for the error count 168 across iterations. For example, the memory system 100 can generate the centered status 626 when the current change direction 630 and the previous change direction 628 are different, such as when the sampling results dither near or passing the minimum point as illustrated in FIG. 3C.

The memory system 100 can further utilize other parameters to generate the centered status 626. For example, the memory system 100 can generate the centered status 626 based on one or more slopes between the center result 304 and the first result 306, the center result 304 and the second result 308, first result 306 and the second result 308, or a combination thereof. Also for example, the memory system 100 can generate the centered status 626 based on a pattern or trend in the various slopes or results corresponding to the adjustments or calibrations over time. The memory system 100 can use the centered status 626 as a flag to break from the offset calculation, the sampling, the evaluation, and the update steps. Instead, the memory system 100 can store the final updated level 624 into the level register 164 corresponding to the evaluated memory page 124.

For the subsequent implementation of the processing-level calibration mechanism 176, the memory system 100 can remove the centered status 626 based on initially comparing the read level voltage 158 and the updated level 624. The memory system 100 maintain the centered status 626 when the read level voltage 158 and the updated level 624 are the same or within a predetermined threshold. The memory system 100 can cancel or remove the centered status 626 when the read level voltage 158 and the updated level 624 are different or further apart than the predetermined threshold.

The memory system 100 can use the updated level 624, the centered status 626, or a combination thereof to keep each of the processing levels 154 or threshold centered. The updated level 624 provides the benefit of improved performance for minimizing the bit error rate during operation of the memory system 100. The updated level 624 and the processing-level calibration mechanism 176 can dynamically update the read level voltage 158 to adjust and calibrate for any changes or wear during intended usage after manufacture, initial configuration, and deployment of the memory device 102.

At block 614, the processing-level calibration mechanism 176 can calculate a gain control 632. The gain control 632 is a parameter configured to dynamically adjust the offset measure 320 representing a separation between the read level voltage 158 and the first offset level 316, the second offset level 318, or a combination thereof. The gain control 632 can be used by the processing-level calibration mechanism 176 to effectively widen or narrow a spacing or separation between the center sample and low/high samples by controlling the offset measure 320. Deviation or offset from the read level voltage 158 set at non-optimum voltages can increase the error count 168. Hence, the gain control 632 can be calculated based on the recovery limit 634, such that the first offset result 306 and the second offset result 308 will stay below the recovery limit 634.

The controller 106, the host device 108, or a combination thereof can calculate the gain control 632 based on the feedback measure 302, such as the error-difference measure 322. The memory system 100 can calculate the gain control 632 in a variety of ways. For example, the memory system 100 can calculate the gain control 632 based on incrementally increasing or decreasing one increment per iteration based on comparing the error-difference measure 322 to a predetermined threshold value or range. Also for example, the memory system 100 can calculate the gain control 632 based on assigning a value according to a predetermined list or table including various possible values for the gain control 632 according to corresponding values of the error-difference measure 322. Also for example, the memory system 100 can utilize a predetermined equation using the error-difference measure 322 as an input to calculate the gain control 632.

As a more specific example, the memory system 100 can determine a number of readings where the error-difference measure 322 exceeds or meets a predetermined threshold. The memory system 100 can combine or aggregate the error-difference measure 322 for the die, such as based on a mathematical combination, a statistical combination or a logical combination of the error-difference measure 322 for the die. The combined or aggregated measure can be used as input to the predetermined threshold, list or table, or equation to calculate the gain control 632.

The gain control 632 can be calculated according to the target profile 402 (FIG. 4). The gain control 632 can further be calculated in an iterative manner. The gain control 632 can be calculated according to a relationship between the gain control 632 and the level distribution profile 410 (FIG. 4) as represented by the predetermined equation, table, list, threshold or range, mechanism, or a combination thereof. The gain control 632 can be calculated to affect the distribution valleys 406 (FIG. 4) according to a relationship thereof to the sampled data as represented by the predetermined equation, table, list, threshold or range, mechanism, or a combination thereof. The gain control 632 can be calculated to have the samples between a minimum and a maximum value for the error-difference measure 322. Furthermore, the gain control 632 can be calculated based on a recovery limit 634. The recovery limit 634 is a constraint on the recoverability of data for the error recovery mechanism 172 (FIG. 1). The recovery limit 634 can be based on the ECC. The recovery limit 634 can describe a number of errors the memory system 100 can handle or correct.

The memory system 100 can calculate the offset measure 320 based on the gain control 632. The memory system 100 can adjust or update the offset measure 320 based on combining it with the gain control 632 or adjusting it according to the gain control 632. For example, the memory system 100 can use the gain control 632 as an offset amount or a factor. Also for example, the memory system 100 can increase or decrease the offset measure 320 according to a number of increments or direction specified by the gain control 632. Also for example, the memory system 100 can use the gain control 632 as an input to a predetermined table or equation to calculate the offset measure 320.

The calculation, the adjustment, or the update of the offset measure 320, the gain control 632, or a combination thereof can be based on the centered status 626. The calculation, the adjustment, or the update of the offset measure 320, the gain control 632, or a combination thereof can occur when all the trims in a die are calibrated, when a minimum or a threshold number of samples have been taken, or a combination thereof. The sampling results, the updated level 624, the centered status 626, the gain control 632, the level-calibration feedback measure 302, a processing or statistical result thereof, or a combination thereof can be stored in the memory device 102, the host device 108, or a combination thereof. The stored information can be accessed across iterations or implementations of the processing-level calibration mechanism 176.

For example, the processing-level calibration mechanism 176 can utilize one or more loops. As a more specific example, an iteration can correspond to one sample of all read level trims of all die associated with the processing-level calibration mechanism 176. Update or adjustment to the read level voltage 158 can occur based on an iteration count reaching a predetermined threshold. Each trim can get an update after it has been sampled a predetermined number of times. The iterations can further be repeated according to each die or the whole set of the memory array 104.

FIG. 6 shows an outer loop and an inner loop for example. The memory system 100 can select a die or a memory page for the outer loop. The inner loop can sample, evaluate results, and determine updates to the read level voltage 158 for a selected trim or page type. The outer loop can bin the results from the inner loop from multiple different blocks over a duration. Once enough inner loop measurements have been completed, the outer loop can adjust or calibrate the read level voltage 158. The inner loop, the outer loop, or both working together can iteratively adjust the read level voltage 158 until the centered status 626 for each of the page types 146 on a selected page or die.

Also for example, the processing-level calibration mechanism 176 can be implemented multiple times over a duration. Each implementation of the processing-level calibration mechanism 176 can be an iteration with or without any separate internal iterative process. The memory system 100 can store information for or resulting from each implementation of the processing-level calibration mechanism 176.

The memory system 100 can store various information across iterations or for access by other mechanisms, such as the target calibration mechanism 178 (FIG. 1), the step calibration mechanism 180 (FIG. 1), or a combination thereof. For example, the memory system 100 can store the error count 168 or a processing result or representation thereof for each page type 146 of each word-line group 144 during sampling phase, after the centered status 626, or a combination thereof. Also for example, the memory system 100 can store the gain control 632, the error-difference measure 322, or a combination thereof. The memory system 100 can implement the target calibration mechanism 178, the step calibration mechanism 180, or a combination thereof after or based on implementing the processing-level calibration mechanism 176 or a portion or an iteration thereof.

The memory system 100 can use the processing-level calibration mechanism 176 to initialize the processing levels 154, dynamically calibrate the processing levels 154, or a combination thereof. The memory system 100 can implement the processing-level calibration mechanism 176 as part of manufacture or configuration of the memory device 102 prior to deployment or intended usage of the memory device 102. The memory system 100 can further dynamically implement the processing-level calibration mechanism 176 and dynamically update the processing levels 154 during deployment or intended usage of the memory device 102 and after the manufacturing or configuration of the memory device 102.

For example, the memory system 100 can initialize and adjust the read level voltage 158 beyond a manufacturing level 640. The manufacturing level 640 can be an instance of the processing levels 154, such as the read level voltage 158, initially provided or configured for manufacture of the memory device 102. The manufacturing level 640 can be a factory default or a configuration default that accounts for an ideal or an estimated behaviors or characteristics of the memory cells 122 instead of the actual behaviors or characteristics.

The memory system 100 can utilize the method 600 to adjust the manufacturing level 640 to the optimum read level voltage 158 for each instance of the memory device 102. The memory system 100 can select, get the trim, calculate complementary levels associated with the trim, sample, evaluate results, and determine update as described above, starting with the manufacturing level 640. The level corresponding to the centered status 626 can be an initialized instance of the read level voltage 158 for deployment, sale, shipping, or the intended usage.

For initialization, the memory system 100 can identify manufacturing levels 640 for representing the processing levels 154 initially determined during manufacturing of the memory array 104. The memory system 100 can use the identification of the manufacturing level 640 as the sampling trigger 620 to implement the steps described above.

The memory system 100 can initially calibrate the processing levels 154 before usage or deployment of the memory array 104 and before dynamically generating the updated level 624. The memory system 100 can initially determine the center result 304 using the manufacturing level 640 for the selected memory cells 122. The memory system 100 can initially determine the offset results using the offset levels different than the manufacturing level 640. The memory system 100 can generate the processing levels 154 based on adjusting the manufacturing level 640 according to the center result 304 and the offset results, and replace the manufacturing level 640 for deployment or intended usage of the memory array 104. The memory system 100 can initialize based on implementing the above described operations at an accelerated rate faster than a rate designed for post deployment implementation.

After the initialization and deployment, and during the intended usage, the memory system 100 can further implement the processing-level calibration mechanism 176 to dynamically calibrate and optimize the processing levels 154. The memory system 100 can continue to track various data and statistics associated with usage of the memory device 102, the processing-level calibration mechanism 176, or a combination thereof. The memory system 100 can use the tracked data to continuously calibrate the processing levels 154.

The dynamic calibration of the read level voltage 158 provides the benefit of improving the overall BER for the memory device 102. Each sample initiated by the processing-level calibration mechanism 176 can return data for a particular die and a particular page type threshold. The returned information can be aggregated and fed back in a closed loop system over many of these operations.

The dynamic calibration of the read level voltage 158 provides the benefit of reducing periodic read level calibrations of a large number of die or trims. This is expected to eliminate or reduce sudden or drastic decreases in performance of the memory device 102 at the time of calibration.

The dynamic calibration of the read level voltage 158 and maintaining the read level voltage 158 at a centered value provides the benefit of reducing trigger events for the error recovery mechanism 172 in situation where the normal ECC using in-line-hard could not otherwise correct the data. The decrease in the trigger events can further improve the performance of the memory device 102 overall.

The gain control 632 provides further accuracy in centering the read level voltage 158. The gain control 632 can be utilized to accurately set the offset measure 320, which can lead to improving the spacing between the offset levels and the read level voltage 158. The improved spacing can improve the tracking of the error counts while staying within the recovery limit 634.

For illustrative purposes, the flow diagram shown in FIG. 6 has been described with a sequence and processes exemplified above. However, it is understood that the method 600 can be different. For example, calculation of the gain control as represented in the block 614 can be an iterative process. Also for example, the gain control can be calculated before or as part of evaluating the results as represented in the block 610. Also for example, the method 600 can further include a voting system for triggering the processing level update in block 612, the calculation of the gain control in block 614, or a combination thereof.

Figure 7:
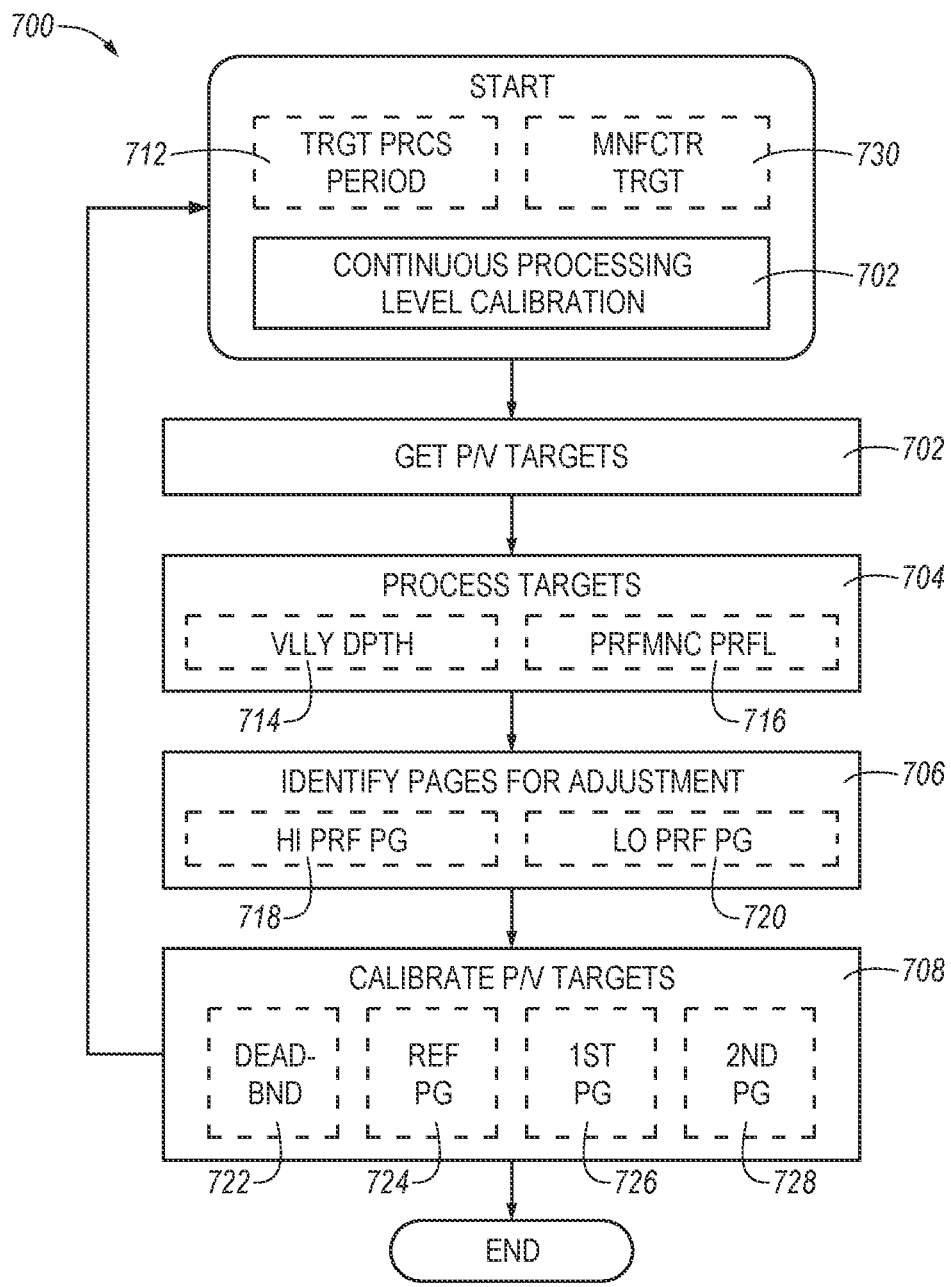
FIG. 7 is a flow diagram illustrating a further example method of operating the memory system in FIG. 1 in accordance with an embodiment of the present technology.

FIG. 7 is a flow diagram illustrating a further example method 700 of operation for the memory system 100 (FIG. 1) in accordance with embodiments of the present technology. The method 700 can include implementation of the target calibration mechanism 178 (FIG. 1). The target calibration mechanism 178 can continuously modify program verification (PV) target locations.

The target calibration mechanism 178 can be executed or implemented, for example, by a processing circuitry for the memory device 102 or the host device 108, such as the controller 106, the memory array 104 (e.g., a die or cells), the processor for the host device 108, or a combination thereof (all FIG. 1). The target calibration mechanism 178 can include the configuration of the controller 106, the memory array 104, the host device 108, or a combination thereof. The target calibration mechanism 178 can further include, one or more methods, processes, steps or instructions, information, or a combination thereof stored within or accessed using the controller 106, the memory array 104, the host device 108, or a combination thereof.

The target calibration mechanism 178 can be utilized or implemented to adjust the target profile 402, such as for one or more of the distribution targets 404, one or more of the distribution valleys 406, or a combination thereof (all FIG. 4). The target calibration mechanism 178 or a portion thereof can be triggered or initiated based on a target processing period 712. The target processing period 712 is a duration or a specific time set for implementing the target calibration mechanism 178 or an iteration or a portion thereof. The target processing period 712 can be based on a state, a signal, a configuration, or a processing value or result for the memory device 102. For example, the target processing period 712 can include or be based on a drive fill interval.

The target calibration mechanism 178 or a portion thereof can be triggered or initiated based on the processing-level calibration mechanism 176 (FIG. 1) or the method 600 (FIG. 6) as represented in block 702. The target calibration mechanism 178 can be implemented based on or after implementing or finishing the processing-level calibration mechanism 176, or one or more iterations thereof. For example, the target calibration mechanism 178 or a portion thereof can begin based on the centered status 626 (FIG. 6) resulting from the processing-level calibration mechanism 176. The target calibration mechanism 178 can use results or byproducts of the processing-level calibration mechanism 176 that continuously calibrates the processing levels 154 (FIG. 1) or a processing result thereof, such as the level-calibration feedback measure 302 (FIG. 3) or the error measure 166 (FIG. 1), as a feedback metric.

Further, implementation or completion of the target calibration mechanism 178 or a portion thereof can retrigger or initiate the processing-level calibration mechanism 176. The target calibration mechanism 178 can dynamically update the target profile 402, which can be used to recalibrate the processing levels 154 (FIG. 1). For example, the memory system 100 can reset, clear, or remove the centered status 626 based on implementing the target calibration mechanism 178. Also for example, the processing-level calibration mechanism 176 can be implemented regardless of or without any initialization from the target calibration mechanism 178.

At block 702, the target calibration mechanism 178 can get the target profile 402 for a grouping of the memory cells 122 (FIG. 1). The memory cells 122, for example, can be selected for the target calibration mechanism 178 in a variety of ways. In one embodiment, the memory system 100 can select the memory cells 122 corresponding to a die. Also for example, the target calibration mechanism 178 can be implemented in or by the die. Also for example, the target calibration mechanism 178 can be implemented independently within each of the word-line group 144 (FIG. 1), regardless of the page map 142 (FIG. 1).

For the selected grouping of the memory cells 122, the memory system 100 can determine, such as by accessing or reading, a current corresponding instance of the target profile 402 stored in the embedded memory of the controller 106, the memory array 104, the host device 108, or a combination thereof. The memory system 100 can further determine based on the background records 174 (FIG. 1) containing the necessary information.

The memory system 100 can determine the target profile 402 including the distribution targets 404, such as the middle targets 409 (FIG. 4) and the edge targets 408 (FIG. 4), the distribution valleys 406, or a combination thereof representing a behavior or a state associated with the processing levels 154 for the memory cells 122. The distribution targets 404 can each correspond to a specific instance of the page type 146 (FIG. 1), a specific content or bit value, or a combination thereof for the memory cells 122.

The distribution valleys 406 can represent a separation between adjacent instances of the distribution targets 404. The distribution valleys 406 can further represent separations of the processing levels 154 between adjacent instances of the page type 146, adjacent instances of the specific content or bit value, or a combination thereof.

At block 704, the target calibration mechanism 178 can process the distribution targets 404 based on a feedback metric. For example, the memory system 100 can sort the distribution targets 404 or representations thereof according to the feedback metric. In one embodiment, the memory system 100 can determine, such as by accessing or reading, the feedback parameters corresponding to the memory cells 122. The memory system 100 can determine the feedback parameters resulting from or calculated based on using the processing level 154 or implementing the processing-level calibration mechanism 176. For example, the memory system 100 can determine the feedback parameters and implement the target calibration mechanism 178 based on the centered status 626 reflecting stability or optimization of the processing levels 154, as discussed above.

In another embodiment, the memory system 100 can determine the feedback parameters associated with dynamically calibrating the processing levels 154 for the memory cells 122, such as the error measure 166, the level-calibration feedback measure 302, or a combination thereof. For example, the memory system 100 can read or access the error count 168 (FIG. 1), the center result 304 (FIG. 3), the error-difference measure 322 (FIG. 3), the level distribution profile 410 (FIG. 4), or a combination thereof.

Also for example, the memory system 100 can determine the feedback parameters including the error-difference measure 322 calculated based on the error measure 166 corresponding to the processing levels 154 for the memory cells 122, such as based on implementing the processing-level calibration mechanism 176 or a modification thereof. The memory system 100 can read or access the error-difference measure 322 calculated based on a difference in the error measure 166 between the center and an average value associated with offset samples, an average thereof across pages or cells, or a combination thereof. The memory system 100 can determine the error-difference measure 322 or an average thereof corresponding to each of the distribution targets 404.

The error-difference measure 322 can correspond to the distribution valleys 406 or a characteristic thereof, the RWB, or a combination thereof. The memory system 100 can determine the error-difference measure 322 or a derivation thereof as a representation of a valley depth 714. The valley depth 714 represents a magnitude or a degree associated with each of the distribution valleys 406. The valley depth 714 can quantitatively represent a magnitude or a degree of separation between the distribution targets 404. The valley depth 714 can further represent or correspond to the RWB for each of the processing levels 154 or the distribution targets 404.

The memory system 100 can further process the target profile 402. In one embodiment, the memory system 100 processes the target profile 402 based on the level-calibration feedback measure 302, such as based on the error-difference measure 322, the error measure 166 or the center result 304, or a combination thereof.

The memory system 100 can determine a target-performance profile 716 representing a relative characteristic or description of the distribution targets 404, the distribution valleys 406, or a combination thereof. For example, the memory system 100 can determine the target-performance profile 716 as a ranking or a sorted listing of the distribution targets 404, the distribution valleys 406, or a combination thereof according to the level-calibration feedback measure 302.

At block 706 the target calibration mechanism 178 can identify specific pages for adjusting the distribution targets 404. The memory system 100 can identify a high performance page 718 and a low performance page 720. The memory system 100 can identify the high performance page 718 and the low performance page 720 based on the target-performance profile 716. The memory system 100 can alternatively identify the high performance page 718 and the low performance page 720 based on comparing the error-difference measure 322, the error measure 166, or a combination thereof corresponding to the distribution targets 404, the distribution valleys 406, or a combination thereof, such as for the target-performance profile 716. The memory system 100 can identify the high performance page 718 and the low performance page 720 each as specific instances of the page type 146, a specific bit or content value, a specific instance of the distribution target 404 or the middle targets 409, or a combination thereof corresponding to highest or lowest instance of the level-calibration feedback measure 302.

In a specific example, the high performance page 718 can include one or more of the distribution target 404 corresponding to the lowest value for the error-difference measure 322, the lowest value for the error count 168 or the center result 304, or a combination thereof. The low performance page 720 can be the distribution target 404 corresponding to the highest value for the error-difference measure 322, the highest value for the error count 168 or the center result 304, or a combination thereof.

The high performance page 718 can represent a specific logic page that is "less-needy", and the low performance page 720 can represent a specific logic page that is "more-needy". The high performance page 718 and the low performance page 720 can be based on the relative RWB of the distribution valleys 406 of the same page type within the word-line group 144. The Most-Needy valley for a page type can be the one that is dominating the error count 168 or causing more BER loss than any other valley. The memory system 100 can use the error-difference measure 322 to determine More-Needy and Less-Needy valleys, an order of needy-ness, as represented by the target-performance profile 716.

The high performance page 718 and the low performance page 720 identified using the level-calibration feedback measure 302 provides the benefit of improving the accuracy in balancing the BER across different page types. The magnitude of the error-difference measure 322 reliably characterizes width of the distribution valleys 406 or the valley depth 714, and thus reliably characterize the RWB. For example, higher values of the error-difference measure 322 correspond to narrower valleys and smaller RWB.

Using the error-difference measure 322 calculated based on three samples resulting from dynamically calibrated read level and controlled with the gain control 632 (FIG. 6) provides the benefit of improving the accuracy in balancing the BER across different page types. The gain control 632 can effectively calibrate the error-difference measure 322 so that the measures between shallow and deep valleys become easier to distinguish. The gain control 632 can maintain the distance between the center sample and the low and high samples for improving resolution. The gain control 632 can provide effective values for the error-difference measure 322 by preventing a sample delta from being too low such that differences are difficult to distinguish, and by preventing the sample delta from being too high such that the overall instances of the error recovery mechanism 172 (FIG. 1) are triggered and render feedback values meaningless.

At block 708, the target calibration mechanism 178 can adjust the PV targets represented by the target profile 402. The memory system 100 can adjust or calibrate the target profile 402 by adjusting one or more of the distribution targets 404, one or more of the distribution valleys 406, or a combination thereof.

The memory system 100 can generate one or more adjusted targets 420 for replacing one or more of the distribution targets 404 and effectively shifting the distribution targets 404. The adjusted targets 420 are the set of desired quantities or occurrences associated for page type, bit, or content value or a combination thereof with voltage levels different than the corresponding distribution targets 404. The adjusted targets 420 can include instances of the distribution targets 404 with changed or adjusted distribution amounts or shapes, corresponding voltage levels, or a combination thereof.

The memory system 100 can generate the adjusted targets 420 (FIG. 4C) based on implementing the processing-level calibration mechanism 176 to dynamically generate the updated level 624 (FIG. 6) and dynamically calibrate the processing levels 154. The memory system 100 can generate the adjusted targets 420 based on or according to the error-difference measure 322.

The memory system 100 can generate the adjusted targets 420 based on changing or shifting one or more instances of the distribution targets 404, the distribution valleys 406, or a combination thereof according to the error-difference measure 322. For example, the memory system 100 can generate the adjusted targets 420 corresponding to or for replacing targets of the high performance page 718, the low performance page 720, or a combination thereof. Also for example, the memory system 100 can generate the adjusted targets 420 for controlling or balancing the distribution valleys 406, the valley depth 714, or a combination thereof corresponding to the high performance page 718, the low performance page 720, or a combination thereof.

The memory system 100 can generate the adjusted targets 420 for the memory cells 122 selected as discussed above. The memory system 100 can generate the adjusted target 420 within the die, within the word-line group 144, regardless of the page map 142, or a combination thereof.

The memory system 100 can generate the adjusted targets 420 in a variety of ways. The memory system 100 can use the edge targets 408 as reference points and adjust the middle targets 409 without adjusting the edge targets 408.

The memory system 100 can also generate the adjusted targets 420 based on a dead-band zone 722. The dead-band zone 722 can represent a threshold range for the error measure 166 corresponding to the processing levels 154 for the distribution targets 404. The memory system 100 can generate the adjusted targets 420 based on comparing the dead-band zone 722 to the error measure 166.

For example, the memory system 100 can generate the adjusted targets 420 corresponding to or for calibrating the middle targets 409, the high performance page 718, the low performance page 720, or a combination thereof. Also as a more specific example, the memory system 100 can generate the adjusted targets 420 when the corresponding distribution targets 404 contains BER outside of the dead-band zone 722.

The memory system 100 can also generate the adjusted targets 420 based on balancing the error measure 166 across the page types 146 for the memory cells 122. The memory system 100 can generate the adjusted targets 420 that would balance and achieve similar levels of the BER, the error count, the valley depth 714, or a combination thereof across the page types 146 for the memory cells 122.

The memory system 100 can also generate the adjusted targets 420 based on shifting or moving the distribution targets 404 according to the target adjustment values 422 (FIG. 4). As a more specific example, the memory system 100 can shift the high performance page 718 and the low performance page 720 by increasing or decreasing corresponding voltages levels and thresholds thereof by the target adjustment values 422.

The memory system 100 can calculate the target adjustment values 422 based on predetermined increments or granularities. The memory system 100 can further calculate the target adjustment values 422 based on determining a magnitude or amount of voltage corresponding to a combination of the valley depth 714 between the high performance page 718 and the low performance page 720. The memory system 100 can calculate the target adjustment values 422 as adjustment amounts that are estimated to balance the valley depth 714 or the RWB between the high performance page 718 and the low performance page 720.

The memory system 100 can further calculate the target adjustment values 422 for the target profile 402 to be net-zero sum. The target adjustment values 422 for the high performance page 718 and the low performance page 720 can be complementary, with the sum of the values being zero. For example, the target adjustment values 422 can represent an amount or magnitude of separation or the valley reduced or taken from the high performance page 718 and given or added to the low performance page 720. The valley corresponding to the high performance page 718 and the RWB associated thereto can be reduced, and the same reduction can be used to increase the valley corresponding to the low performance page 720 and the RWB associated thereto.

As such, the memory system 100 can generate the adjusted targets 420 corresponding to the target adjustment values 422 for balancing the error measure 166, the valley depth 714, or a combination thereof across different page types 146 for the memory cells 122. For TLC, the memory system 100 can generate the adjusted targets 420 corresponding to the target adjustment values 422 for balancing and evening the BER between the LP 148 (FIG. 1), the UP 150 (FIG. 1) and the EP 152 (FIG. 1).

The memory system 100 can generate the adjusted targets 420 to perform BER leveling further based on the error count 168 as well as based on matching the RWB. The memory system 100 can generate the adjusted targets 420 based on matching the error count 168 for the center sample, such as for the center result 304, across the distribution targets 404. The memory system 100 can further generate the adjusted targets 420 based on matching the error-difference measure 322 across the distribution targets 404.

As an illustrative example, the center-samples can be used as the feedback metric to equalize the LP/UP/XP error rates by moving PV targets accordingly. Further, in addition to the center-samples, the valley depth can be matched for each page type. The memory system 100 implementing the target calibration mechanism 178 can equalize the read threshold levels for RWB and balance the page types for BER.

The memory system 100 can maintains a constant RWB, but manages adjustments for improved BER and page type BER matching. The memory system 100 can have as fixed the PV targets for the edge targets 408, such as targets labeled L1 and L7 PV targets in FIG. 4A. Adjustments to PV targets for the middle targets 409, such as targets labeled L2-L6 in FIG. 4A, can be managed such that page type BER is continuously matched.

Continuing with the illustrative example, the memory system 100 can set a reference page type 724 and match other page types iteratively. Using TLC as an example, the reference page type 724 can be one of the LP 148, the UP 150, or the EP 152.

For one instance of the target processing period 712, the memory system 100 can match the reference page type 724 with a first page type 726 different than the reference page type 724. As a result, the memory system 100 can generate the adjusted targets 420 corresponding to the reference page type 724 and the first page type 726.

For another instance of the target processing period 712, the memory system 100 can match the reference page type 724 with a second page type 728 different than both the reference page type 724 and the first page type 726. As a result, the memory system 100 can generate the adjusted targets 420 corresponding to the reference page type 724 and the second page type 728.

For illustrative example, the memory system 100 can generate the adjusted targets 420 based on determining the page type 146 corresponding to the low performance page 720 for the worst instance of BER. When the worst case BER is outside of the dead-band zone 722, the memory system 100 can generate the adjusted targets 420 for implementing net-zero PV target change.

When the reference page type 724 corresponds to the error count 168 lower than the first page type 726, the reference page type 724 or a valley associated thereto can give up or reduce the PV margin by the target adjustment value 422. The low performance page 720 of the first page type 726 or a valley associated thereto can receive or increase the PV margin by the target adjustment value 422. The target adjustment value 422 can be one or more of predetermined increments or a value dynamically calculated for averaging the PV margin between the two page types.

In one embodiment, the memory system 100 can generate the adjusted targets 420 for replacing the distribution targets 404 corresponding to the reference page type 724 for L3/L4 as illustrated in FIG. 4A. The adjusted targets 420 can be based on reducing PV margin for the distribution targets 404 of L3/L4 by one step or increment, thereby decreasing the corresponding valley v4. The adjusted targets 420 can further be for replacing the distribution targets 404 corresponding to the first page type 726 for L1/L2 or L5/L6 as illustrated in FIG. 4A. The adjusted targets 420 can be based on increasing the PV margin for the distribution targets 404 of L1/L2 or L5/L6 by one step or increment, thereby increasing the corresponding valley v2 or v6.

When L3/L4 give to L1/L2, the distribution targets 404 of L2 and L3 can increase in value and move right in relation to the illustrations in FIGS. 4A-4C. When L3/L4 give to L5/L6, the distribution targets 404 of L4 and L5 can decrease in value and move left in relation to the illustrations in FIGS. 4A-4C.

When the reference page type 724 corresponds to the error count 168 higher than the first page type 726, the reference page type 724 or a valley associated thereto can gain or increase the PV margin by the target adjustment value 422. The high performance page 718 of the first page type 726 or a valley associated thereto can give up or decrease the PV margin by the target adjustment value 422.

In one embodiment, the memory system 100 can generate the adjusted targets 420 based on increasing PV margin for the distribution targets 404 of L3/L4 by one step or increment, thereby increasing the corresponding valley v4. The adjusted targets 420 can further be based on decreasing the PV margin for the distribution target 404 of L1/L2 or L5/L6 by one step or increment, thereby decreasing the corresponding valley v2 or v6.

When L3/L4 takes from L1/L2, the distribution targets 404 of L2 and L3 can decrease in value and move left in relation to the illustrations in FIGS. 4A-4C. When L3/L4 takes from L5/L6, the distribution targets 404 of L4 and L5 can increase in value and move right in relation to the illustrations in FIGS. 4A-4C.

In one embodiment, the memory system 100 can similarly generate the adjusted targets 420 based on determining the page type 146 corresponding to the low performance page 720 for the worst instance of BER. When the worst case BER is outside of the dead-band zone 722, the memory system 100 can generate the adjusted targets 420 for implementing net-zero PV target change for the middle targets 409. The memory system 100 can generate the adjusted targets 420 further based on the target-performance profile 716 based on an average of the error-difference measure 322.

When the reference page type 724 corresponds to the error count 168 or the error-difference measure 322 lower than the second page type 728, the reference page type 724 or a valley associated thereto can give up or reduce the PV margin by the target adjustment value 422. The low performance page 720 of the second page type 728 or a valley associated thereto can receive or increase the PV margin by the target adjustment value 422.

In one embodiment, the memory system 100 can generate the adjusted targets 420 for replacing the distribution targets 404 corresponding to the reference page type 724 for L3/L4. The adjusted targets 420 can be based on reducing PV margin for the distribution targets 404 of L3/L4 by one step or increment, thereby decreasing the corresponding valley v4. The adjusted targets 420 can further be for replacing the distribution targets 404 corresponding to the second page type 728 for L2/L3, L4/L5 or L6/L7. The adjusted targets 420 can be based on increasing the PV margin for the distribution targets 404 of L2/L3, L4/L5 or L6/L7 by one step or increment, thereby increasing the corresponding valleys v3, v5 or v7.

When L3/L4 give to L2/L3, the distribution target 404 for L3 can increase in value and move right in relation to the illustrations in FIGS. 4A-4C. When L3/L4 give to L4/L5, the distribution target 404 for L4 can decrease in value and move left. When L3/L4 gives to L6/L7, the distribution targets 404 for L4, L5 and L6 can decrease in value and move left.

When the reference page type 724 corresponds to the error count 168 or the error-difference measure 322 higher than the second page type 728, the reference page type 724 or a valley associated thereto can gain or increase the PV margin by the target adjustment value 422. The high performance page 718 of the second page type 728 or a valley associated thereto can give up or decrease the PV margin by the target adjustment value 422, such as for one or more increment or a value calculated for averaging the PV margin between the two page types.

In one embodiment, the memory system 100 can generate the adjusted targets 420 based on increasing PV margin for the distribution targets 404 of L3/L4 by one step or increment, thereby increasing the corresponding valley v4. The adjusted targets 420 can further be based on decreasing the PV margin for the distribution targets 404 of L2/L3, L4/L5 or L6/L7 by one step or increment, thereby increasing the corresponding valleys v3, v5 or v7.

When L3/L4 takes from L2/L3, the distribution target 404 of L3 can decrease in value and move left in relation to the illustrations in FIGS. 4A-4C. When L3/L4 takes from L4/L5, the distribution target 404 of L4 can increase in value and move right. When L3/L4 takes from L6/L7, the distribution targets 404 for L4, L5 and L6 can increase in value and move right.

The memory system 100 can use the target calibration mechanism 178 to initialize the target profile 402, dynamically calibrate the target profile 402, or a combination thereof. The memory system 100 can implement the target calibration mechanism 178 as part of manufacture or configuration of the memory device 102 prior to deployment or intended usage of the memory device 102. The memory system 100 can further dynamically implement the target calibration mechanism 178 and dynamically generate the adjusted targets 420 and dynamically update the target profile 402 during deployment or intended usage of the memory device 102 and after the manufacturing or configuration of the memory device 102.

For example, the memory system 100 can start with each PV target in the default state as defined by the NAND factory settings or manufacturing target 730. The manufacturing target 730 can be an instance of the target profile 402 initially provided or configured for manufacture of the memory device 102. The manufacturing target 730 can be a factory default or a configuration default that accounts for an ideal or an estimated behaviors or characteristics of the memory cells 122 instead of the actual behaviors or characteristics. The factory targeting can be different for each instance of the word-line group 144.

The memory system 100 can utilize the method 700 to adjust the manufacturing target 730 to the target profile 402 optimum for each instance of the memory device 102. The memory system 100 can get the targets, process the targets, identify relevant pages or valleys, and adjust the targets as described above, starting with the manufacturing target 730. The targets at the end of initially implementing the target calibration mechanism 178 can be an initialized instance of the target profile 402 for deployment, sale, shipping, or the intended usage. The memory system 100 can further continue to dynamically implement the target calibration mechanism 178 thereafter.

For initialization, the memory system 100 can identify the manufacturing target 730 for representing the target profile 402 initially determined during manufacturing of the memory array 104. The memory system 100 can use the identification of the manufacturing target 730 as a trigger to implement the steps described above.

The memory system 100 can initially calibrate the target profile 402 before usage or deployment of the memory array 104 and before dynamically generating the adjusted targets 420. The memory system 100 can initially adjust the read level voltage 158 according to the center result 304 and the offset results, such as by implementing the processing-level calibration mechanism 176. The memory system 100 can initially determine the level-calibration feedback measure 302 based on implementing the read level voltage 158 following the initial adjustment. The memory system 100 can generate the target profile 402 based on changing distribution targets 404 of the manufacturing target 730 according to the feedback measure as discussed above.

The memory system 100 can initialize based on implementing the above described operations at an accelerated rate faster than a rate designed for post deployment implementation. The memory system 100 can implement the processing-level calibration mechanism 176, the target calibration mechanism 178, the step calibration mechanism 180 (FIG. 1), or a combination thereof at an accelerated rate for a short period of time in the factory so that each word-line group 144 will have improved and converged read thresholds prior to running customer firmware.

The adjusted or calibrated instance of the target profile 402, where the adjusted targets 420 have replaced corresponding distribution targets 404, can be used to further trigger the processing-level calibration mechanism 176. For example, the target calibration mechanism 178 can function as an outer loop, and the processing-level calibration mechanism 176 can function as an inner loop. The processing-level calibration mechanism 176 can further update the processing levels 154 according to or in response to dynamic updates or calibrations of the target profile 402.

Allowing a PV target change using the target calibration mechanism 178 can require that most blocks in a die are programmed with the same PV targets. As such, nearly a complete refresh of block programming may be required. The memory system 100 can accordingly maintain a minimum set of two different PV target programmed block groups. The memory system 100 can further uses a single set of read thresholds for the processing-level calibration mechanism 176 to operate properly, minimizing BER diversity.

The memory system 100 can store various information across iterations or for access by other mechanisms, such as the processing-level calibration mechanism 176, the step calibration mechanism 180 (FIG. 1), or a combination thereof. For example, the memory system 100 can store the target profile 402 or a threshold thereof for each page type 146 of each word-line group 144. Also for example, the memory system 100 can store the target-performance profile 716.

Based on implementing the target calibration mechanism 178, the memory system 100 can implement the step calibration mechanism 180. For example, the memory system 100 can leverage the RWB and BER equalization across page types to dynamically adjust the programming step 162 (FIG. 1) in programming the memory cells 122. Details regarding the step calibration mechanism 180 are discussed below.

Generating the adjusted targets 420 for dynamically calibrating the target profile 402 based on the error measure 166, the error-difference measure 322, or a combination thereof provides the benefit of increasing endurance (more total Program/Erase Cycles) for each NAND die in a system product. The dynamic balancing can ensure that no one page type will dominate the end of life criteria, which is demonstrated as excessive trigger rate tail behavior. The BER of each page type can be maintained to be approximately the same throughout the life of a system product, and further minimize BER sigma.

Generating the adjusted targets 420 for dynamically updating the target profile 402 based on a feedback metric associated with the error measure 166 provides the benefit of balancing page type BER. The memory system 100 can utilize the error measure 166 resulting from the processing-level calibration mechanism 176 as feedback measure, which can function as a processing metric for balancing the BER dynamically. Moreover the reuse of the processing results from the processing-level calibration mechanism 176 can enable the target calibration mechanism 178 to be implemented with a very modest amount of additional firmware overhead.

For illustrative purposes, the flow diagram has been described with a sequence and processes exemplified above. However, it is understood that the method 700 can be different. For example, blocks 702-708 can be an iterative process with a feedback loop from block 708 to block 702. Also for example, the method 700 can include a complementary pair of processes matching the reference page type 724 to the first page type 726 for one drive fill, and matching the reference page type 724 to the second page type 728 for a subsequent drive fill.

Figure 8:
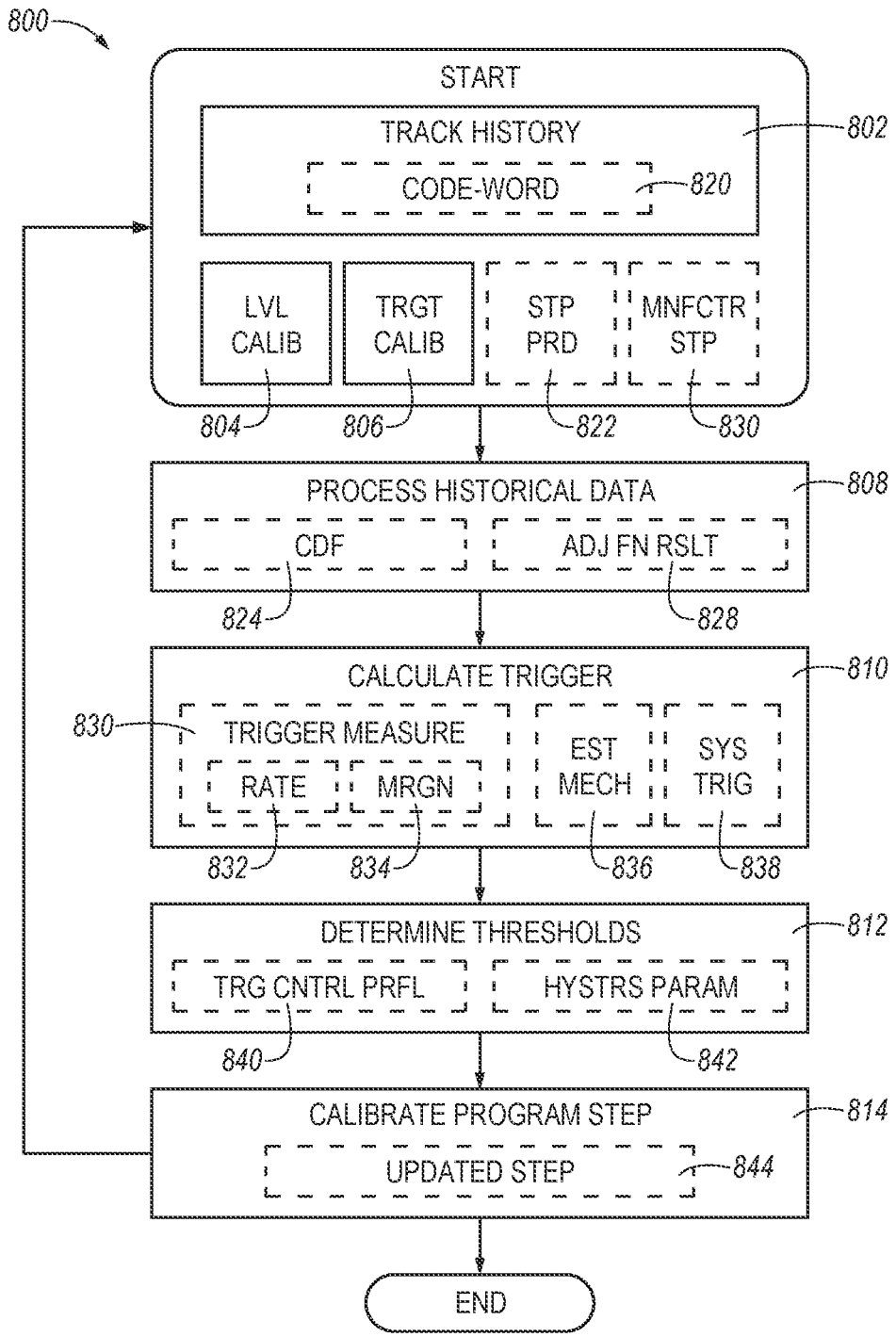
FIG. 8 is a flow diagram illustrating another example method of operating the memory system in FIG. 1 in accordance with an embodiment of the present technology.

FIG. 8 is a flow diagram illustrating another example method 800 of operation for the memory system 100 (FIG. 1) in accordance with embodiments of the present technology. The method 800 can include implementation of the step calibration mechanism 180 (FIG. 1). The step calibration mechanism 180 can continuously modify the programming step 162 (FIG. 1) based on a feedback metric associated with operation of the memory device 102 (FIG. 1). The step calibration mechanism 180 can continuously adjust or calibrate the NAND page programming time 502 (FIG. 5) throughout the life of the memory device 102.

The step calibration mechanism 180 can be executed or implemented, for example, by a processing circuitry for the memory device 102 or the host device 108, such as the controller 106, the memory array 104, such as a die or cells, processor for the host device 108, a portion therein or a combination thereof (all FIG. 1). The step calibration mechanism 180 can include the configuration of the controller 106, the memory array 104, the host device 108, or a combination thereof. The step calibration mechanism 180 can further include, one or more methods, processes, steps or instructions, information, or a combination thereof stored within or accessed using the controller 106, the memory array 104, the host device 108, or a combination thereof. The step calibration mechanism 180 can be utilized or implemented to adjust the programming step 162, such as for programming the memory cells 122 (FIG. 1) based on ISPP. The memory system 100 can determine and utilize the background records 174 (FIG. 1) for the step calibration mechanism 180. The memory system 100 implementing the step calibration mechanism 180 can calibrate the programming step 162 based on the background records 174, such as for background scan data or a derivation thereof, as feedback metric.

The memory system 100 can determine the background records 174 during operation of the memory device 102, such as represented in block 802. The memory system 100 can determine the background records 174 in a variety of ways. For example, the memory system 100 can determine the background records 174 based on storing or tracking information, performance or status associated with processing of the data during operation of the memory device 102. The memory system 100 can store or track the error measure 166 (FIG. 1), such as the error count 168 (FIG. 1) or the error rate 170 (FIG. 1) or a processing result thereof, associated with or resulting from using the programming step 162 during operation of the memory array 104.

The memory system 100 can track the error measure 166 associated with one or more code-words 820, the programming step 162 being utilized to write the data. Increase in the programming step 162 can lead to increased BER. The background scan can read the code-words 820 in its search for "bad data". The error measure 166, such as for a number of bit errors, can be determined and tracked. The memory system 100 can also track the error measure 166 using bins for various numbers of errors. Also as a more specific example, the memory system 100 can track the error measure 166 using a histogram type of format.

The memory system 100 can implement the step calibration mechanism 180 by, per, or within the memory cells 122 of each die. For example, the memory system 100 can use the processing circuitry controlling or within each of the die to implement the step calibration mechanism 180. Also for example, the memory system 100 can further implement the step calibration mechanism 180 without being restricted to, without making adjustments by, or according to the word-line group 144 (FIG. 1). The step calibration mechanism 180 can be performed by die program step size adjustments, without making adjustments by the word-line group 144 in contrast to the target calibration mechanism 178 (FIG. 1).

The step calibration mechanism 180 or a portion thereof can be triggered or initiated based on a step processing period 822. The memory system 100 implementing the target calibration mechanism 178 can adjust the programming step 162 during or for the step processing period 822. The step processing period 822 is a duration or a specific time set for implementing the step calibration mechanism 180 or an iteration or a portion thereof. The step processing period 822 can be based on a state, a signal, a configuration, or a processing value or result for the memory device 102. For example, the step processing period 822 can include or be based on a drive fill interval. Also for example, the step processing period 822 can be the same type as, concurrent or staggered with, or a combination thereof in comparison to the target processing period 712 (FIG. 7).

The step calibration mechanism 180 or a portion thereof can further be triggered or initiated based on the processing-level calibration mechanism 176 (FIG. 1) or the method 600 (FIG. 6) as represented in block 804 for continuous processing level calibration, the target calibration mechanism 178 (FIG. 1) or the method 700 (FIG. 7) as represented in block 806 for continuous PV target verification, or a combination thereof. For example, the step calibration mechanism 180 can be implemented based on implementing the processing-level calibration mechanism 176 to dynamically calibrate the processing levels 154 (FIG. 1) including the read level voltage 158 (FIG. 1). The step calibration mechanism 180 can be implemented based on the centered status 626 for (FIG. 6) the read level voltage 158.

Also for example, the step calibration mechanism 180 can be implemented based on implementing the target calibration mechanism 178 to dynamically calibrate the target profile 402 (FIG. 4). The step calibration mechanism 180 can be implemented based on implementing the target calibration mechanism 178 more than a predetermined threshold number of times, when all relevant trims are centered as indicated by the centered status 626 for the read level voltage 158, or a combination thereof for the die.

Also, the step calibration mechanism 180 can be implemented less frequently than the target calibration mechanism 178. The delayed rate or implementation of the step calibration mechanism 180 can ensure the processing levels 154 are otherwise stable, and further ensure enough data points have been collected for the background records 174 subsequent to dynamic calibrations of the read level voltage 158, the PV target, or a combination thereof.

At block 808, the step calibration mechanism 180 can process the background records 174 for calibrating the programming step 162. The memory system 100 can process the background records 174, such as manipulating the data structurally, logically, mathematically, or a combination thereof. For example, the memory system 100 can generate a cumulative distribution function (CDF) 824 based on processing the background records 174. The CDF 824 can represent a statistical probability associated with the error measure 166. The CDF 824 can represent the probability that the error measure 166 is less than or equal to a certain value. The CDF 824 can be generated based on or for normalizing the background records 174.

The memory system 100 can generate the CDF 824 in a variety of ways. For example, the memory system 100 can iteratively update the CDF 824 and persistently maintain the CDF 824. The memory system 100 can update the CDF 824 as the background records 174 are continuously determined. Also for example, the memory system 100 can generate the CDF 824 for each iteration or implementation of the step calibration mechanism 180 to calibrate the programming step 162 instead of iteratively updating the CDF 824 and without persistently maintaining the CDF 824.

Also for example, the memory system 100 can further generate an adjusted function result 828 based on further processing the CDF 824. The adjusted function result 828 can represent a processing result from further manipulating or processing the CDF 824 or the background records 174, such as by shifting, logical or mathematical operations, restructuring or formatting the CDF 824 or the background records 174.

The adjusted function result 828 can include a waterfall organization or format of the CDF 824 or the background records 174. Also, the adjusted function result 828 can include one or more predetermined values combined with the CDF 824 or the background records 174, such as for a multiplicative factor or an additive offset.

At block 810, the step calibration mechanism 180 can calculate a trigger for updating or calibrating the programming step 162. The memory system 100 can derive the trigger based on processing the feedback data, such as for the background scan data. The memory system 100 can derive the trigger based on calculating a trigger measure 830.

The trigger measure 830 is a representation of a current operating status of the memory cells 122 with respect to the error recovery mechanism 172 (FIG. 1) and the programming step 162. The trigger measure 830 can estimate implementation of the error recovery mechanism 172, such as for a likelihood thereof or a frequency thereof. The trigger measure 830 can further represent overhead or a separation for implementing the error recovery mechanism 172. The trigger measure 830 can be calculated based on the background records 174 or a processing result thereof, such as the CDF 824 or the adjusted function result 828.

The memory system 100 can calculate the trigger measure 830 in a variety of ways. For example, the trigger measure 830 can include a trigger rate 832, a trigger margin 834, or a combination thereof.

The trigger rate 832 is an estimate of a frequency or a likelihood of implementing the error recovery mechanism 172. The trigger rate 832 can further estimate a projection of the error measure 166 for various conditions or situations, such as based on varying the programming step 162. The trigger rate 832 can represent a projection of BER. For example, the trigger rate 832 can be associated with uncorrectable bit error rate (UBER). Also for example, the trigger rate 832 can be based on ECC bits in error associated with the error recovery mechanism 172, a rate or a measure for the code-words 820, or a combination thereof.

The memory system 100 can calculate the trigger rate 832 using an estimation mechanism 836. The estimation mechanism 836 can include a process, a method, a circuit, a configuration, a function, or a combination thereof for projecting further behavior or pattern based on a given set of data. For example, the estimation mechanism 836 can include a process, a method, a circuit, a configuration, a function, or a combination thereof for implementing a line fitting algorithm, such as for linear or logarithmic patterns, a statistical likelihood calculation, or a combination thereof.

The memory system 100 can calculate the trigger rate 832 based on using the background records 174 or a derivation thereof, such as the CDF 824 or the adjusted function result 828, as input for the estimation mechanism 836. The memory system 100 can project or estimate the a frequency or a likelihood of implementing the error recovery mechanism 172, a projection of the error count 168, or a combination thereof according to a pattern or a trend in the background records 174.

The trigger margin 834 is representation of a relationship between implementation of the error recovery mechanism 172 and the error measure 166 corresponding to the programming step 162. For example, the trigger margin 834 can represent a separation between a system trigger condition 838 for implementing the error recovery mechanism 172 and the error count 168. The system trigger condition 838 can include a predetermined condition for initiating the error recovery mechanism 172, such as a number of error bits or a number of bad or incorrect instances of the code-words 820. Improved performance associated with the programming time 502 can be bounded by the trigger margin 834, which can be a measure of the rate of system product ECC recovery.

The memory system 100 can calculate the trigger margin 834 based on the system trigger condition 838 and the error measure 166. For example, the memory system 100 can calculate the trigger margin 834 based on a relationship or a separation, such as a ratio or a difference between the value, between the system trigger condition 838 and the error count 168. The error count 168 can represent a number of bit errors at a predetermined threshold for initiating a change in the programming step 162. Also for example, the memory system 100 can calculate the trigger margin 834 based on a logarithmic representation of the system trigger condition 838 and the error count 168.

The memory system 100 can calculate the trigger measure 830 directly from the error count 168. For the trigger measure 830 the memory system 100 can use available data rather than performing a line fit and projecting beyond the amount of data that has been collected, such as in comparison to the trigger rate 832.

At block 812, the step calibration mechanism 180 can determine one or more thresholds for evaluating the trigger measure 830. The memory system 100 can determine the thresholds based on determining the trigger control profile 840.

The trigger control profile 840 is a predetermined threshold or range for evaluating the trigger measure 830 and updating or changing the programming step 162 for calibration. The trigger control profile 840 can include a limit, a threshold, or a range for the trigger rate 832, the trigger margin 834, or a combination thereof. For example, the trigger control profile 840 can include a probability, a rate or a magnitude of error, or a combination thereof for initiating update of the programming step 162.

The memory system 100 can change the value of the programming step 162 based on comparing the trigger measure 830 and the trigger control profile 840. The trigger control profile 840 can be predetermined outside of the step processing period 822 by a developer or a designer, a manufacturer, a user, the memory system 100, or a combination thereof.

The memory system 100 can determine the trigger control profile 840 by accessing the trigger control profile 840 stored in the host device 108 or the memory device 102. The memory system 100 can further determine the trigger control profile 840 based on adjusting the value thereof according to a hysteresis parameter 842. The hysteresis parameter 842 is a parameter for controlling repetitive patterns in updates to the programming step 162. The hysteresis parameter 842 can be configured to minimize dither of changing the programming step 162 successively in opposite directions. The hysteresis parameter 842 can be used to maintain the programming step 162 when the conditions are borderline or near the limits. The hysteresis parameter 842 can create a dead band where no updates are made. The hysteresis parameter 842 can be a value associated with the trigger control profile 840, such as based on a mathematical derivative using a factor, an offset, or a combination thereof with the trigger control profile 840. The hysteresis parameter 842 can be predetermined outside of the step processing period 822, similar to the trigger control profile 840.

The memory system 100 can adjust the trigger control profile 840 based on the hysteresis parameter 842. For example, the memory system 100 can combine the predetermined value of the trigger control profile 840 with the hysteresis parameter 842 to adjust or further determine the trigger control profile 840. The predetermined value of the trigger control profile 840 can be a threshold value. When the hysteresis parameter 842 is set or present, the trigger control profile 840 can be a range centered around the initial threshold value, with the range size based on the hysteresis parameter 842. The range can be calculated based on both increasing and decreasing the initial threshold value according to the hysteresis parameter 842, such as by multiplying/dividing or adding/subtracting the hysteresis parameter 842 or a processing derivative thereof to the initial threshold value.

At block 814, the step calibration mechanism 180 can calibrate the programming step 162. The memory system 100 can calibrate the programming step 162 based on generating an adjusted step 844 as a new value or instance of the programming step 162 to replace the existing value thereof. The adjusted step 844 can be for providing a calibrated value of the programming step 162. The memory system 100 can calibrate the programming step 162 based on the trigger control profile 840 and the trigger measure 830, such as for the trigger rate 832 or the trigger margin 834. The memory system 100 can generate the adjusted step 844 for calibrating the programming step 162 based on comparing the trigger control profile 840 and the trigger measure 830. For example, the memory system 100 can generate the adjusted step 844 for increasing the programming step 162 when the trigger rate 832 is less than the trigger control profile 840. The memory system 100 can generate the adjusted step 844 for decreasing the programming step 162 when the trigger rate 832 is greater than the trigger control profile 840. When the trigger rate 832 is equal to the trigger control profile 840 or between the range of the trigger control profile 840 based on the hysteresis parameter 842, the memory system 100 can maintain the programming step 162.

Also for example, the memory system 100 can generate the adjusted step 844 for increasing the programming step 162 when the trigger margin 834 is greater than the trigger control profile 840. The memory system 100 can generate the adjusted step 844 for decreasing the programming step 162 when the trigger margin 834 less than the trigger control profile 840. When the trigger rate 832 is equal to the trigger control profile 840 or between the range of the trigger control profile 840 based on the hysteresis parameter 842, the memory system 100 can maintain the programming step 162.

The memory system 100 can generate the adjusted step 844 as a positive or a negative value of one or more predetermined increments for adjusting the programming step 162. The memory system 100 can further generate the adjusted step 844 based on combining, such as according to a difference, a ratio, or an average, of the trigger control profile 840 and the trigger measure 830. The memory system 100 can further generate the adjusted step 844 for increasing or decreasing the programming time 502 associated with the programming step 162. The memory system 100 can decrease the programming time 502 by increasing the programming step 162, and increase the programming time 502 by decreasing the programming step 162. Further, the memory system 100 can further generate the adjusted step 844 for increasing or decreasing the error measure 166 associated with the programming step 162. The memory system 100 can decrease the programming step 162 to reduce the error measure 166, and increase the programming step 162 at the cost of increasing the error measure 166.

The memory system 100 can generate the adjusted step 844 for balancing the programming time 502 and the error measure 166 associated with programming the data into the memory array 104. The memory system 100 can generate the adjusted step 844 to improve the programming time 502 while maintaining acceptable level of errors as represented by the trigger control profile 840. The memory system 100 can generate the adjusted step 844 for improving the programming time 502 while maintaining the trigger measure 830, such as at a fixed error rate or a fixed error margin represented by the trigger control profile 840, over operation or usage of the memory array 104.

The memory system 100 can use the step calibration mechanism 180 to initialize the programming step 162, dynamically calibrate the programming step 162, or a combination thereof. The memory system 100 can implement the step calibration mechanism 180 as part of manufacture or configuration of the memory device 102 prior to deployment or intended usage of the memory device 102. The memory system 100 can further dynamically implement the step calibration mechanism 180 and dynamically generate the adjusted step 844 and dynamically update the programming step 162 during deployment or intended usage of the memory device 102 and after the manufacturing or configuration of the memory device 102.

For example, the memory system 100 can start with each programming step in a default state as defined by the NAND factory settings or manufacturing step 846. The manufacturing step 846 can be an instance of the programming step 162 initially provided or configured for manufacture of the memory device 102. The manufacturing step 846 can be a factory default or a configuration default that accounts for an ideal or an estimated behaviors or characteristics of the memory cells 122 instead of the actual behaviors or characteristics.

The memory system 100 can utilize the method 800 to adjust the manufacturing step 846 to the programming step 162 balancing errors and programming time for each instance of the memory device 102. The memory system 100 can implement the above described operations starting with the manufacturing step 846. The programming step values at the end of initially implementing the step calibration mechanism 180 can be an initialized instance of the programming step 162 for deployment, sale, shipping, or an intended usage. For initialization, the memory system 100 can identify the manufacturing step 846 for representing the programming step 162 initially determined during manufacturing of the memory array 104. The memory system 100 can use the identification of the manufacturing step 846 as a trigger to implement the steps described above.

The memory system 100 can initially calibrate the programming step 162 before usage or deployment of the memory array 104 and before dynamically generating the adjusted step 844. The memory system 100 can initially adjust the read level voltage 158 according to the center result 304 (FIG. 3) and the offset results, such as by implementing the processing-level calibration mechanism 176. The memory system 100 can further initially adjust the PV targets, such as by implementing the target calibration mechanism 178. The data can be loaded or written to the memory circuit during the processes using the manufacturing step 846.

The memory system 100 can initially determine the background records 174 associated with the manufacturing step 846 and calculate the trigger measure 830 based on the background records 174. The memory system 100 can generate the programming step 162 according to the trigger measure 830 for updating and replacing the manufacturing step 846 as described above.

The memory system 100 can initialize based on implementing the above described operations at an accelerated rate faster than a rate designed for post deployment implementation. The memory system 100 can implement the processing-level calibration mechanism 176, the target calibration mechanism 178, the step calibration mechanism 180 (FIG. 1), or a combination thereof at an accelerated rate for a short period of time in the factory so that the memory cells 122 will have improved and converged programming steps prior to running customer firmware.

The memory system 100 can further continue to dynamically implement the step calibration mechanism 180 thereafter. The memory system 100 can further use the manufacturing step 846 as a minimum threshold for the programming step 162. The memory system 100 will likely increase the programming step 162 initially after manufacture of the memory device 102. The memory system 100 will likely decrease the programming step 162 throughout life or usage of the memory device 102 to adjust for the physical wear or deterioration of the memory array 104. The memory system 100 can use the manufacturing step 846 as a lower limit or smallest instance of the programming step 162 for the dynamic calibrations. The memory system 100 can dynamically generate the adjusted step 844 for maintaining the programming step 162 greater than or equal to the manufacturing step 846.

The adjusted or calibrated instance of the programming step 162, where the adjusted step 844 replaced the previous instance or value of the programming step 162, can be used to further trigger the processing-level calibration mechanism 176, the target calibration mechanism 178, or a combination thereof. For example, the memory system 100 can readjust the read level voltage 158 according to the new programming step 162. Also for example, the memory system 100 can readjust the target profile 402 according to the new programming step 162. The memory system 100 can further take advantage of the balanced error rates and RWB across pages to calibrate the programming step 162.

The memory system 100 can store various information across iterations or for access by other mechanisms, such as the processing-level calibration mechanism 176, the target calibration mechanism 178, or a combination thereof. For example, the memory system 100 can store the cumulative distribution function, the trigger measure 830, the adjusted step 844, or a combination thereof. The trigger measure 830 processed using the adjusted function result 828 based on the background records 174 provides the capability to dynamically calibrate the programming step 162. The dynamic and continuous calibration of the programming step 162 throughout life of the memory cells 122 is quite unlike what one of ordinary skill in the art would currently know or expect. The dynamic and continuous calibration of the programming step 162 can improve the system performance by trading off unnecessary performance or over performance in error characteristics to gain shorter programming time 502.

Generating the adjusted step 844 for dynamically calibrating the programming step 162 provides the benefit of improving system product performance throughout the life of the memory array 104. The adjustment of the programming step 162 improves the programming time 502 specifically for the real-time and actual condition or status of the memory array 104. The adjusted step 844 dynamically generated using the trigger measure 830 processed using the adjusted function result 828 based on the background records 174 provides the benefit of increased accuracy in representing the real-time and actual condition or status of the memory array 104. The accurate representation of the trigger measure 830 can be used to update the programming time 502 while maintaining acceptable levels of error.

For illustrative purposes, the flow diagram has been described with a sequence and processes exemplified above. However, it is understood that the method 800 can be different. For example, blocks 808-814 can be an iterative process with a feedback loop (not shown) from block 814 to block 808. Also for example, blocks 812 and 814 can be combined into one step.

Figure 9:
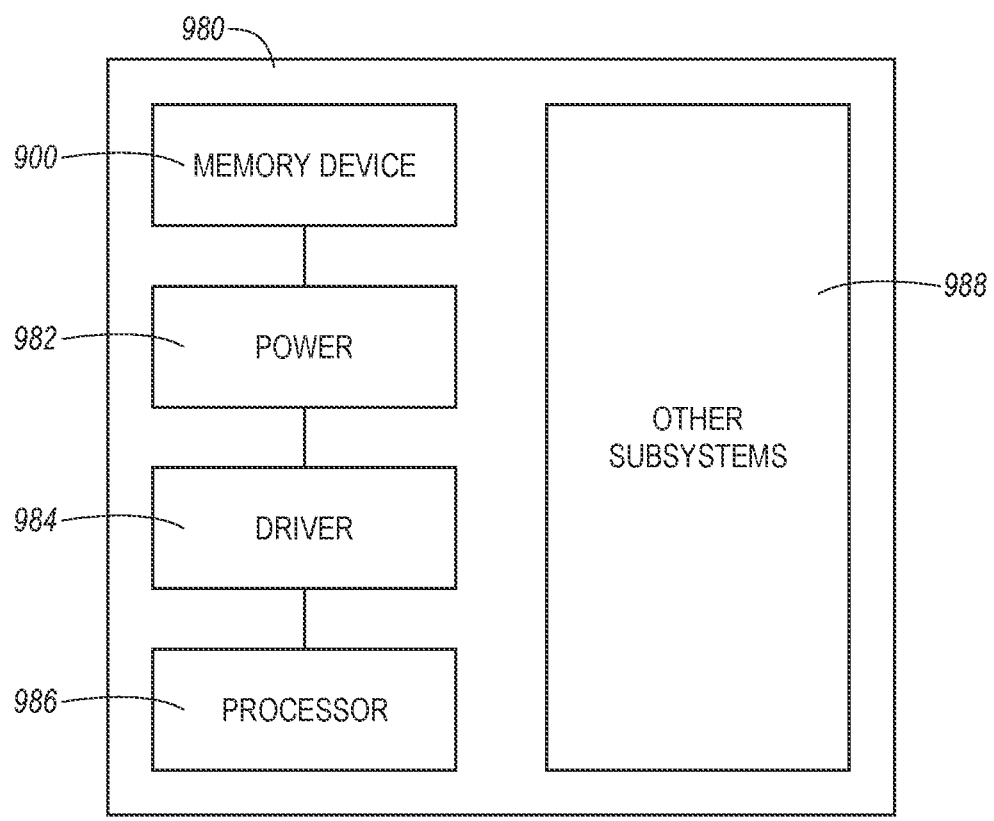
FIG. 9 is a schematic view of a system that includes a memory device in accordance with an embodiment of the present technology.

FIG. 9 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 980 shown schematically in FIG. 9. The system 980 can include a memory device 900, a power source 982, a driver 984, a processor 986, and/or other subsystems or components 988. The memory device 900 can include features generally similar to those of the memory device described above with reference to FIGS. 1-7, and can therefore include various features for performing a direct read request from a host device. The resulting system 980 can perform any of a wide variety of functions, such as memory storage, data processing, and/or other suitable functions. Accordingly, representative systems 980 can include, without limitation, hand-held devices (e.g., mobile phones, tablets, digital readers, and digital audio players), computers, vehicles, appliances and other products. Components of the system 980 may be housed in a single unit or distributed over multiple, interconnected units (e.g., through a communications network). The components of the system 980 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
a memory array including a plurality of memory cells; and
a controller coupled to the memory array, the controller configured to:
determine a target profile including distribution targets, wherein each of the distribution targets represents a target distribution of program-verify levels for a logic value,
determine a feedback measure based on for processing data stored in the memory array, wherein the feedback measure represents a separation between adjacent distributions,
wherein the controller is further configured to determine the feedback measure based on error counts associated with a set of read-level voltages,
wherein the feedback measure is calculated based on a difference in a first error count and a second error count corresponding to different read-level voltages, and
dynamically adjust the target distribution of program-verify levels according to the feedback measure.

2. The memory device of claim 1 wherein the controller is further configured to determine the feedback measure based on an error measure associated with the logic value and/or adjacent distributions.

3. The memory device of claim 1 wherein the controller is further configured to dynamically adjust the target distribution of program-verify levels based on adjusting separations between targeted distribution levels for adjacently configured logic values.

4. The memory device of claim 1 wherein the controller is further configured to dynamically adjust the target distribution of program-verify levels balancing a processing measure across multiple page types for the memory cells.

5. The memory device of claim 4 wherein the controller is further configured to dynamically adjust the target distribution of program-verify levels based on an overall net-zero change in the processing measure for the target profile.

6. The memory device of claim 1 wherein:
the target distribution of program-verify levels are configured to control resulting distribution of actual program-verify levels associated with the logic value for the memory cells; and
the controller is configured to:
determine the feedback measure resulting from implementing a processing level, and
update the processing level according to the adjusted program-verify target.

7. A memory device, comprising:
a memory array including a plurality of memory cells arranged in memory pages; and
a controller coupled to the memory array, the controller configured to:
determine a target profile including edge targets and middle targets, wherein each of the targets represent a target distribution of program-verify voltages corresponding to a logic value for the memory cells,
determine a feedback measure based on reading the memory cells, wherein the feedback measure represents a separation between adjacent distributions of program-verify voltages,
wherein the controller is further configured to determine the feedback measure based on error counts associated with a set of read-level voltages,
wherein the feedback measure is calculated based on a difference in a first error count and a second error count corresponding to different read-level voltages, and
dynamically adjust the target profile based on adjusting one or more of the middle targets according to the feedback measure.

8. The memory device of claim 7 wherein the controller is configured to dynamically adjust the target profile independently for each word-line group.

9. The memory device of claim 7 wherein the controller is further configured to dynamically adjust the target profile balancing error measures and valley depths across page types for the memory cells, wherein each of the error measures corresponds to a read level voltage for a specific logic value associated with one of the page types, and wherein the valley depths characterize voltage separations between distributions of program-verify voltages for adjacently occurring logic values.

10. The memory device of claim 7 wherein the controller is further configured to:
determine a reference page type for the memory cells;
determine a second page type; and
for a target processing period, dynamically adjust one or more of the middle targets corresponding to the reference page type, the second page type, or both.

11. The memory device of claim 10 wherein the controller is further configured to:
determine a third page type different than both the reference page type and the second page type; and
for a subsequent processing period, dynamically further change one or more of the middle targets corresponding to the reference page type, the third page type, or both.

12. The memory device of claim 7 wherein the controller is further configured to:
identify a high performance page with lowest occurrence of errors among page types;
identify a low performance page with highest occurrence of errors among the page types; and
dynamically change one or more of the middle targets based on adjusting voltage separations adjacent to one or more target distributions for the high performance page, the low performance page, or a combination thereof.

13. A method of operating a memory device, the method comprising:
determining a target profile including targeted distributions program-verify levels for corresponding logic values stored in memory cells within a memory array, wherein the target profile includes edge targets and middle targets, wherein (1) the edge targets are instances of the targeted distributions for logic values represented using highest and lowest voltage levels and (2) the middle targets are instances of the distribution targets that are between the edge targets;

determining a feedback measure based on reading data from the memory cells,
  wherein the feedback measure represents a separation between adjacent distributions of program-verify levels,
  wherein the feedback measure corresponds to read errors;

dynamically adjusting the target profile by relocating the target distributions according to the feedback measure,
  wherein dynamically adjusting the target profile includes updating one or more middle targets according to the feedback measure;

determining the feedback measure corresponding to a difference in the read errors resulting from different read-level voltages.

14. The method of claim 13, further comprising:
calibrating a read-level voltage for the memory cells; and
wherein:
  the feedback measure is calibrated during or after the calibration of the read-level voltage.

15. The method of claim 13, wherein dynamically adjusting the target profile includes:
  determining a reference page type representing one of the page types of the memory cells;
  determining a second page type; and
  for a target processing period, dynamically adjusting the target profile based on adjusting one or more of the targeted distributions corresponding to the reference page type, the second page type, or both.

16. The method of claim 15, wherein dynamically adjusting the target profile includes:
  determining a third page type different than both the reference page type and the second page type; and
  for a subsequent processing period, further adjusting one or more of the targeted distributions corresponding to the reference page type, the third page type, or both.

* * * * *